United States Patent
Curbow et al.

(10) Patent No.: US 11,652,473 B2
(45) Date of Patent: May 16, 2023

(54) POWER MODULES HAVING AN INTEGRATED CLAMP CIRCUIT AND PROCESS THEREOF

(71) Applicant: Cree Fayetteville, Inc., Fayetteville, AR (US)

(72) Inventors: Austin Curbow, Fayetteville, AR (US); Daniel Martin, Fayetteville, AR (US)

(73) Assignee: WOLFSPEED, INC., Durham, NC (US)

(*) Notice: Subject to any disclaimer, the term of this patent is extended or adjusted under 35 U.S.C. 154(b) by 0 days.

(21) Appl. No.: 15/382,172

(22) Filed: Dec. 16, 2016

(65) Prior Publication Data

US 2018/0175833 A1 Jun. 21, 2018

(51) Int. Cl.
*H05K 1/18* (2006.01)
*H03K 3/013* (2006.01)
(Continued)

(52) U.S. Cl.
CPC .............. *H03K 3/013* (2013.01); *H01L 25/00* (2013.01); *H01L 25/072* (2013.01); *H03K 5/08* (2013.01);
(Continued)

(58) Field of Classification Search
CPC ........ H03K 3/013; H03K 5/08; H05K 1/0306; H05K 1/181; H05K 1/182; H05K 1/18; H05K 2201/10166
See application file for complete search history.

(56) References Cited

U.S. PATENT DOCUMENTS 7,292,451 B2 * 11/2007 Rodriguez ............ H02M 7/003
361/775
9,013,848 B2 * 4/2015 Lui ..................... H01L 27/0255
361/91.5
(Continued)

FOREIGN PATENT DOCUMENTS

JP 2006296119 A 10/2006
JP 2007-082024 A 3/2007
(Continued)

OTHER PUBLICATIONS

Wolfspeed, "CAS325M12HM2 1.2kV, 3.6 mΩ All-Silicon Carbide High Performance, Half-Bridge Module," datasheet, May 2016.
(Continued)

*Primary Examiner* — Jung Kim
(74) *Attorney, Agent, or Firm* — BakerHostetler

(57) ABSTRACT

The disclosure is directed to a power module apparatus that includes a base plate, a power substrate positioned relative to the base plate, at least two power contacts, a gate-source board mounted relative to the power substrate, gate drive connectors electrically connected to the gate-source board, a housing secured to the power substrate, and a clamping circuit electrically connected to the at least one power device. The clamping circuit being configured to clamp an input to a gate of the at least one power device. The clamping circuit being arranged with at least one of the following: the base plate, the power substrate, one of the at least two power contacts, the at least one power device, the gate-source board, the gate drive connectors, and the housing. The disclosure is further directed to a process of configuring a power module apparatus.

17 Claims, 22 Drawing Sheets

(51) Int. Cl.
  *H03K 5/08* (2006.01)
  *H05K 1/03* (2006.01)
  *H03K 17/082* (2006.01)
  *H01L 25/07* (2006.01)
  *H01L 25/00* (2006.01)
  *H03K 17/16* (2006.01)

(52) U.S. Cl.
  CPC ..... *H03K 17/0822* (2013.01); *H03K 17/0826* (2013.01); *H03K 17/165* (2013.01); *H05K 1/0306* (2013.01); *H05K 1/181* (2013.01); *H01L 2224/48091* (2013.01); *H05K 2201/10166* (2013.01)

(56) References Cited

U.S. PATENT DOCUMENTS

| | | | |
|---|---|---|---|
| 9,300,285 B2* | 3/2016 | Pang | H03K 17/08104 |
| 9,426,883 B2* | 8/2016 | McPherson | H05K 1/0296 |
| 2011/0050316 A1 | 3/2011 | Sicard | |
| 2015/0162321 A1* | 6/2015 | Briere | H01L 29/778 |
| | | | 257/195 |
| 2015/0216067 A1 | 7/2015 | McPherson et al. | |

FOREIGN PATENT DOCUMENTS

| | | |
|---|---|---|
| JP | 2009207077 A | 9/2009 |
| JP | 2009-284370 A | 12/2009 |
| JP | 2013-503556 A | 1/2013 |
| JP | 201479037 A | 5/2014 |
| JP | 2014187543 A | 10/2014 |
| JP | 2015126342 A | 7/2015 |
| KR | 20150071339 A | 6/2015 |
| WO | WO 2015/116924 A1 | 8/2015 |

OTHER PUBLICATIONS

T. Funaki, "A study on self turn-on phenomenon in fast switching operation of high voltage power MOSFET," 2013 3rd IEEE CPMT Symposium Japan, Kyoto, 2013, pp. 1-4.

T. Funaki, "A Study on the self turn-on phenomenon of power MOSFET induced by the turn-off operation of body diodes" IEICE 2014 Electronics Express, vol. *, No. *, pp. 1-6, DOI:10.1587/elex. 11.20140350, Publicized Jun. 12, 2014.

P. Bogonez-Franco and J. B. Sendra "EMI comparison between Si and SiC technology in a boost converter" EMC Europre 2012 C1-3 (2012).

* cited by examiner

POWER MODULES HAVING AN INTEGRATED CLAMP CIRCUIT AND PROCESS THEREOF

STATEMENT REGARDING FEDERALLY SPONSORED RESEARCH OR DEVELOPMENT

This invention was made with Government support by the Army Research Laboratory: Contract No. W911NF-16-2-0132. The United States government has certain rights in the invention.

BACKGROUND OF THE DISCLOSURE

1. Field of the Disclosure

This disclosure is directed to power modules having an integrated clamp circuit. Moreover, the disclosure is directed to a process of configuring power modules that include an integrated clamp circuit.

2. Related Art

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

One of the common problems faced when operating a power module is inadvertent operation due to parasitic current and/or voltage signals.

For example, higher changes in voltage over time during a switching operation can induce a parasitic turn on of a switch in the power module. A number of approaches have been utilized to address this inadvertent operation in associated driver circuitry. However, these approaches have been less than satisfactory.

Accordingly, what is needed is a power module configured to limit inadvertent operation due to parasitic signals in order to enable proper control of the power module.

SUMMARY OF THE DISCLOSURE

According to an aspect of the disclosure, a power module apparatus includes a power substrate, at least one power device electrically connected to the power substrate, a gate-source board mounted relative to the power substrate, the gate-source board electrically connected to the at least one power device, gate drive connectors electrically connected to the gate-source board, a housing secured to the power substrate, and a clamping circuit electrically connected to the at least one power device, the clamping circuit configured to clamp an input to a gate of the at least one power device, the clamping circuit being arranged with at least one of the following: a base plate, the power substrate, one of the at least two power contacts, the at least one power device, the gate-source board, gate drive connectors, and the housing.

According to an aspect of the disclosure, a power module apparatus includes a power substrate positioned relative to a base plate; at least one power device electrically connected to at least two power contacts; a gate-source board mounted relative to the power substrate, the gate-source board electrically connected to the at least one power device; a clamping circuit electrically connected to the at least one power device, the clamping circuit configured to clamp an input to a gate of the at least one power device, wherein the clamping circuit arrangement results in better performance of the at least one power device with respect to a prior art power device, the clamping circuit arrangement being with at least one of the following: the base plate, the power substrate, one of at least two power contacts, the at least one power device, the gate-source board, gate drive connectors, and a housing.

According to an aspect of the disclosure, a process of configuring a power module apparatus includes providing a base plate defining a topology pattern, providing a power substrate positioned relative to the base plate, providing at least two power contacts, each of the at least two power contacts electrically connected to the power substrate, providing at least one power device electrically connected to the at least two power contacts, providing a gate-source board mounted relative to the power substrate, the gate-source board electrically connected to the at least one power device, providing gate drive connectors electrically connected to the gate-source board, providing a housing secured to the power substrate, and providing a clamping circuit electrically connected to the at least one power device, the clamping circuit configured to clamp an input to a gate of the at least one power device, arranging the clamping circuit with at least one of the following: the base plate, the power substrate, one of the at least two power contacts, the at least one power device, the gate-source board, the gate drive connectors, and the housing.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
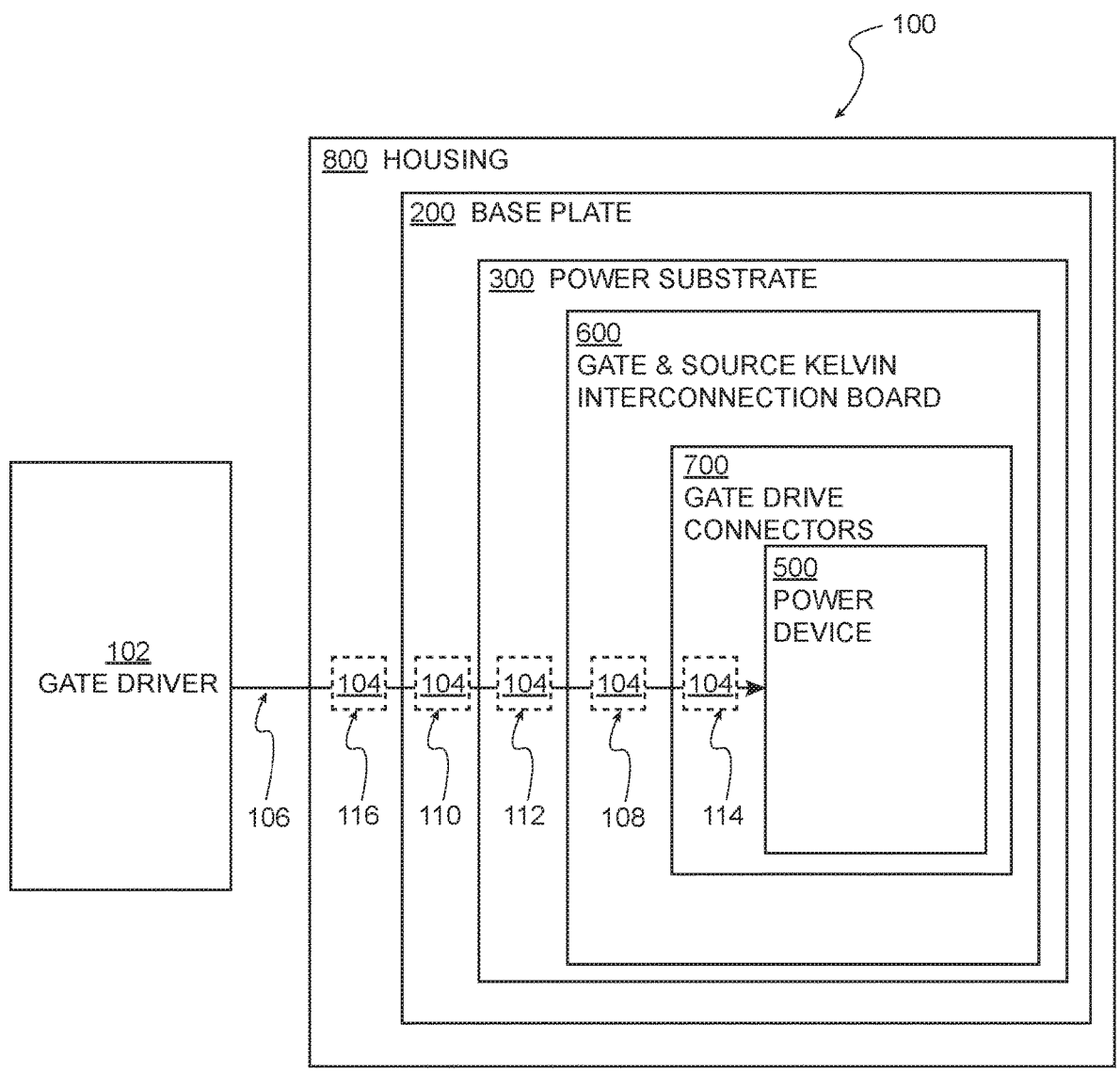
FIG. 1 illustrates a schematic view of a power module according to an aspect of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

FIG. 1 illustrates a schematic view of a power module according to an aspect of the disclosure. As shown in FIG. 1, one exemplary aspect of the disclosure is generally shown as a power module 100. The power module 100 may be configurable in a number of useful power electronic topologies such as half bridge, full bridge, common source/emitter, common drain/collector, and the like. The power module 100 can be configured in two, four, six, or more separate channels. Moreover, the power module 100 can be configured with any number of separate channels.

The power module 100 may include a number of elements including a base plate 200, a power substrate 300, power contacts 400 (shown in FIG. 5), power devices 500, a gate-source printed circuit board (PCB) 600, gate drive connectors 700, and a housing 800. The power module 100 further includes a clamp circuit 104. The clamp circuit 104 is arranged in or on the power module 100. The arrangement of the elements illustrated in FIG. 1 is merely for illustrating the various locations of the clamp circuit 104 and not necessarily indicative of the arrangement and positioning of the elements. Moreover, it is contemplated that the power module 100 may include fewer or different elements than those described herein.

A gate driver 102 may be arranged separate from the power module 100 and may be connected to the power devices 500 of the power module 100 along a signal line 106. The gate driver 102 may provide one or more gate drive signals to the power devices 500 along the signal line 106. The gate driver 102 can be any type of driver. The gate driver 102 may be a bipolar driver, a high performance driver, a higher frequency switching driver, a driver having structure for handling current of 10 to 15 amps (A), and the like. The gate driver 102 may be any type of driver configured for driving the disclosed power devices 500.

The clamp circuit 104 may be arranged in or on the power module 100. In one aspect, the clamp circuit 104 may be arranged on or with the gate-source PCB 600 as indicated by arrow 108. In one aspect, the clamp circuit 104 may be arranged on or with the base plate 200 as indicated by arrow 110. In one aspect, the clamp circuit 104 may be arranged on or with the power substrate 300 as indicated by arrow 112. In one aspect, the clamp circuit 104 may be arranged on or with the gate drive connectors 700 as indicated by arrow 114. In one aspect, the clamp circuit 104 may be arranged on or with the housing 800 as indicated by arrow 116. In one aspect, the clamp circuit 104 may be arranged on the power module 100. In one aspect, the clamp circuit 104 may be arranged inside the power module 100. In one aspect, the clamp circuit 104 may be arranged on the power contacts 400. In one aspect, the clamp circuit 104 may be arranged on the power devices 500. In one aspect, the clamp circuit 104 may be arranged in the power devices 500. Each of these locations of the clamp circuit 104 being defined as being in close physical proximity to the power module 100 or integrated into the power module 100.

In one aspect, the clamp circuit 104 may be a Miller Clamp. In another aspect, the clamp circuit 104 may be an active Miller Clamp. The clamp circuit 104 may enable a gate of the power devices 500 to be held off in a presence of a rapid change in voltage on a drain/collector of the power devices 500. The rapid change in voltage on a drain/collector being one cause of parasitic turn on. The clamp circuit 104 may be configured to hold the gate of one of the power devices 500 low so that any disturbance seen on the gate may be minimized and/or eliminated. To better control the gate of the power devices 500, the clamp circuit 104 may be placed in close physical proximity to the gate of the power device 500 it is intended to control as shown in FIG. 1. Placing the clamp circuit 104 in close physical proximity to the power module 100 improves performance of the power devices 500. Moreover, placing the clamp circuit 104 in close physical proximity to the power module 100 reduces customer complexity with respect to operation and control of the power module 100. In this regard, the driver complexity and operation may be greatly simplified by utilization of the clamp circuit 104 of the disclosure implemented in the power module 100. In one aspect, a driver operating a power module 100 according to the disclosure does not have to account for potential parasitic turn on issues thus reducing the complexity of the driver. Moreover, physical coupling, arrangement, and location in close physical proximity to the power module 100 enables better gate control of the power devices 500 and allows the clamp circuit 104 to hold the gate off much better than prior art implementations placed with a gate driver outside a power module.

In operation, the clamp circuit 104 limits and reduces the effect of undesired voltage and/or currents input to a gate of the power devices 500. In other words, the clamp circuit 104 clamps the input to the gate of the power devices 500 to inhibit undesired operation of the power devices 500 such as parasitic turn on.

The clamp circuit 104 may be implemented with a plurality of clamp circuits. For example, a clamp circuit 104 for each channel of the power module 100. In one aspect there are two clamp circuits 104. In one aspect there are four clamp circuits 104. In one aspect there are six clamp circuits 104. In one aspect, each of the power devices 500 may include a clamp circuit 104. Moreover, the power module 100 can be configured with any number of channels and with any number of clamp circuits 104 per channel.

Implementations of the disclosed clamp circuit 104 reduce the issues with respect to a shoot through event within the power module 100, which results in inadvertent operation of the power devices 500, such as parasitic turn on. Moreover, the clamp circuit 104 provides better controllability of the power module 100 and the power devices 500. In this regard, placing the clamp circuit 104 in close physical proximity to the power devices 500 reduces parasitics. For example, parasitic resistance, parasitic induction, high impedance, and the like, which all are increased when switching at a high-frequency. Moreover, parasitic resistance, parasitic induction, high impedance, and the like may all be increased when the clamp circuit is located outside a power module. The parasitics are at least one cause of parasitic turn on.

Additionally, the resulting gate driver structure of the gate driver 102 may have reduced complexity. Furthermore, the gate driver 102 implemented with the power module 100 of the disclosure avoids the need for a bipolar driver. Additionally, the location of the clamp circuit 104 helps to avoid undesired switching (e.g., parasitic turn on affect) of the power devices 500 which increases robustness, reliability, reduces failures, and the like of the power module 100. In this regard, parasitic turn on of the power module 100 has a detrimental impact that reduces device life.

The operation of the clamp circuit 104 may be controlled with a sense and control circuit or the like. In this regard, the clamp circuit 104 may be discretely operated by input of an input signal signaling the clamp circuit 104 to clamp the voltage and/or current input to the gate of the power devices 500. Similarly, the clamp circuit 104 may be discretely operated by input of an input signal signaling the clamp circuit 104 to not clamp the voltage and/or current input to the gate of the power devices 500. In this regard, the clamp circuit 104 input may be an input signal to control the operation of the clamp circuit 104. The control signal may be generated by logic that is self-controlled. The logic may be a hardwired circuit comprising logic gates. For example a single converter. In one aspect, the control signal logic may operate as a function of a current switching state of one of the power devices 500. In one aspect, the control signal logic may operate as a function of a current desired switching state of one of the power devices 500. In one aspect, the control logic may be configured to actuate the clamp circuit 104 at least partially during the time when the power device 500 is switched off. In one aspect, the control logic may be configured to deactivate the clamp circuit 104 at least partially during the time when the power device 500 is switched on. In another aspect, the control logic may be configured to actuate the clamp circuit 104 during the time when the power device 500 is switched off. In another aspect, the control logic may be configured to deactivate the clamp circuit 104 during the time when the power device 500 is switched on. In one aspect, the control logic may be configured to actuate the clamp circuit 104 at least partially during the time when the gate driver 102 switches off the power device 500. In one aspect, the control logic may be configured to deactivate the clamp circuit 104 at least partially during the time when the gate driver 102 switches on the power device 500. In one aspect, the control logic may be configured to actuate the clamp circuit 104 during the time when the gate driver 102 switches off the power device 500. In one aspect, the control logic may be configured to deactivate the clamp circuit 104 during the time when the gate driver 102 switches on the power device 500.

In one aspect, the power devices 500 may include a switching device such as a power Field Effect Transistor (FET). However, the power device 500 may be implemented with any type of transistor or switch. For example, the power devices 500 may include any device having a Metal-Oxide Semiconductor (MOS) front end including a MOSFET, a silicon carbide MOS, a trench MOS, an insulated-gate bipolar transistor (IGBT), any MOS structure, and/or the like and combinations thereof.

The base plate 200 may provide mechanical support, heat spreading, and a structure to effectively attach the power module 100 to a heat sink or a cold plate. The material properties of the base plate 200 become increasingly important as the temperature of operation elevates. The base plate 200 material may be selected with consideration of the coefficient of thermal expansion (CTE) where materials in the assembly could otherwise expand at different rates due to heat and create large stresses at their interfaces.

The base plate 200 may utilize a Metal Matrix Composite (MMC) material, which may be a composite of a high conductivity metal, copper, aluminum, etc., and either a low CTE metal such as molybdenum, beryllium, tungsten, or the like and/or a nonmetal such as silicon carbide, beryllium oxide, graphite, or the like. These composite materials may combine features of each contributing element, allowing for a high thermal conductivity with a CTE which may be substantially matched with the power substrate 300 to which it is attached.

The power substrate 300 may be a metal-ceramic-metal layered structure. Of course, other materials may be utilized for the power substrate 300. The power substrate 300 may be configured and designed to handle very high currents and voltages. Metals of the structure may be copper, aluminum, or the like at varying thicknesses, while the ceramic materials of the structure may be alumina ($Al_2O_3$), aluminum nitride (AlN), silicon nitride ($Si_3N_4$), or the like.

The housing 800 may be formed of an insulating material, synthetic material, or the like. In one aspect the housing 800 may be a plastic material. In one aspect, the housing 800 may be formed in an injection molding process with reinforced high temperature plastic. The housing 800 may serve a number of functions in addition to being a protective barrier to the power devices 500. These may include voltage blocking, mechanical support, guides for the power contacts, entry zones for gel passivation, vents for a gel passivation process, self-strengthening internal ribs, and the like.

The gate-source PCB 600 may include independent electrical paths for each switch position that may be required to form gate and source kelvin connections for controlling the power devices 500. In one aspect, the gate-source PCB 600 may be placed over the power substrate 300 and then connected to the base plate 200. The gate-source PCB 600 may include attachments for the gate drive connectors 700. The gate drive connectors 700 may be configured to connect to the signal line 106 in order to receive drive signals from the gate driver 102. The gate-source PCB 600 may provide the drive signals from the gate drive connectors 700 to the power devices 500.

Figure 2:
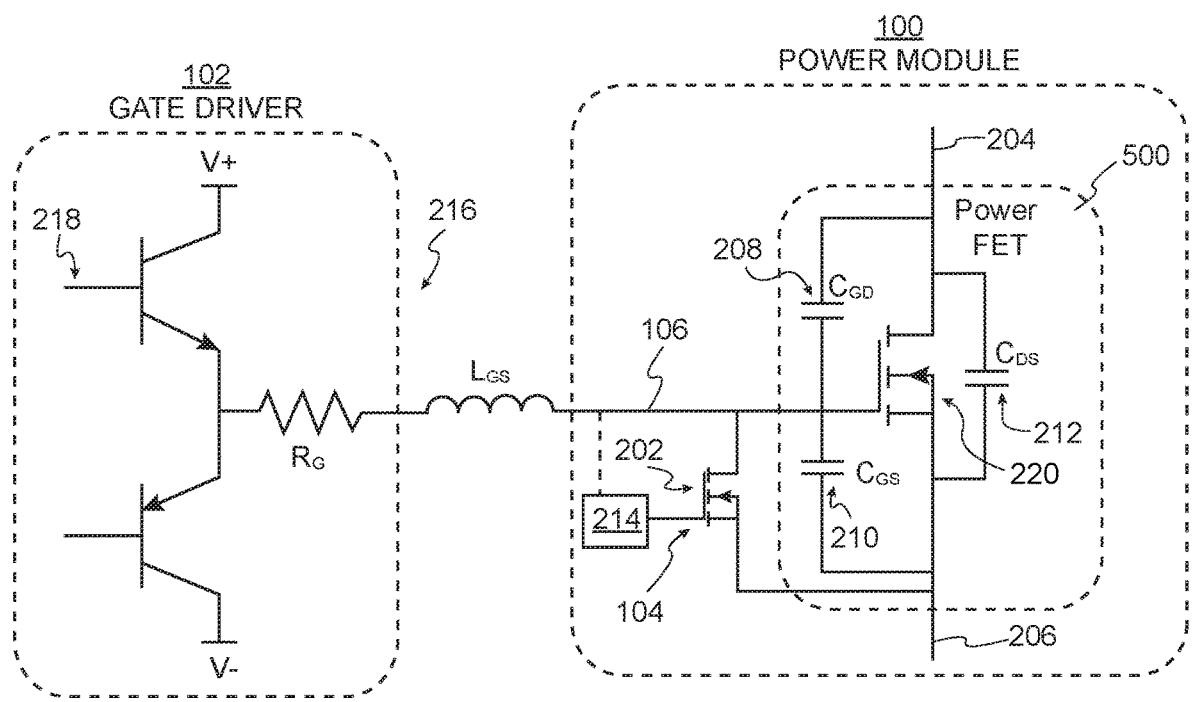
FIG. 2 illustrates a schematic view of an implementation of the power module of FIG. 1.

FIG. 2 illustrates a schematic view of an implementation of the power module of FIG. 1. In particular, FIG. 2 shows an implementation of the clamp circuit 104 implemented as a Miller Clamp. The clamp circuit 104 may include a transistor 202 tied to the signal line 106 and to a source/emitter 206 of the power device 500. This implementation may enable a 0 V turn off drive that can simplify the gate driver 102 implementation. The FIG. 2 implementation shorts a gate of the power device 500 to the source/emitter 206 when implemented. Additionally, FIG. 2 illustrates that the clamp circuit 104 is arranged in close physical proximity to the power module 100. In particular, the clamp circuit 104 is arranged within the power module 100 as described above in relation to FIG. 1. This close physical proximity arrangement providing a number of benefits including the benefits described above. As further shown in FIG. 2, the power module 100 may further include a sense and control circuit 214. The sense and control circuit 214 sensing current, voltage, and/or the like within the power module 100 and controlling the clamp circuit 104 in response thereto. In one aspect, the sense and control circuit 214 may sense a voltage and/or current on the signal line 106 and enable or disable the clamp circuit 104 accordingly. In one aspect, the sense and control circuit 214 may detect the gate driver 102 drive signal on the signal line 106 and disable the clamp circuit 104. Furthermore, the sense and control circuit 214 may detect the lack of the gate driver 102 drive signal on the signal line 106 and enable the clamp circuit 104. Of course other types of control logic are contemplated as well.

In the FIG. 2 aspect, the power device 500 may be a power FET that includes a transistor 220. Of course other types of power devices 500 are contemplated as well as described above. The power device 500 in the FIG. 2 implementation includes a drain/collector 204 and the source/emitter 206. The power device 500 may further include a capacitor 212 connected between the drain/collector 204 and the source/emitter 206. The power device 500 may further include a capacitor 208 connected between the drain/collector 204 and the signal line 106. The power device 500 may further include a capacitor 210 connected between the source/emitter 206 and the signal line 106. Of course other circuit arrangements are contemplated as well for the power devices 500.

FIG. 2 further illustrates an exemplary structure of the gate driver 102. The gate driver 102 may include one or more transistors 218 tied to V+ and V−. The gate driver 102 may further include circuit elements 216. The circuit elements 216 may be implemented with a series resistor $R_G$ and/or inductor $L_{GS}$. Other components for the gate driver 102 are contemplated as well.

Figure 3:
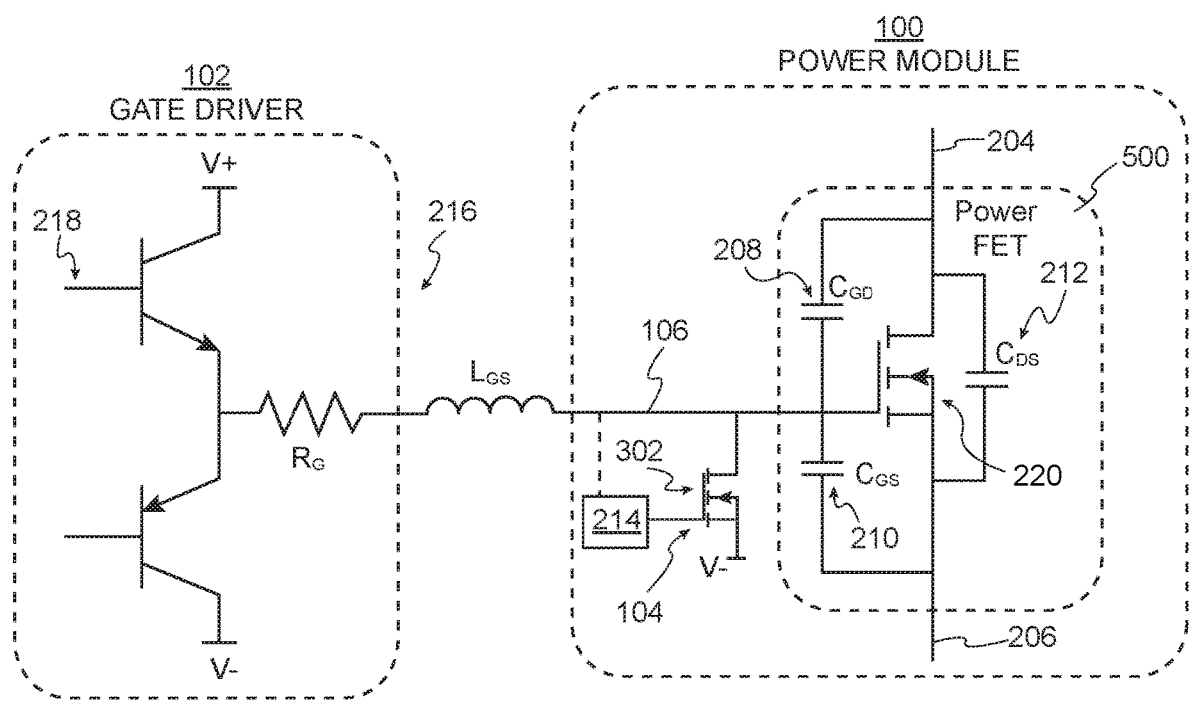
FIG. 3 illustrates a schematic view of another implementation of the power module of FIG. 1.

FIG. 3 illustrates a schematic view of another implementation of the power module of FIG. 1. In particular, FIG. 3 shows an implementation of the clamp circuit 104 implemented as a Miller Clamp. The clamp circuit 104 may include a transistor 302 tied to the signal line 106 and V−. This implementation holds the gate of the power device 500 off with a −V bias. This implementation has been found to provide improved hold-off capability. Additionally, FIG. 3 illustrates that the clamp circuit 104 is arranged in close physical proximity to the power module 100. In particular, the clamp circuit 104 is arranged within the power module 100 as described above in relation to FIG. 1. This close physical proximity arrangement providing a number of benefits including the benefits described above.

Figure 4:
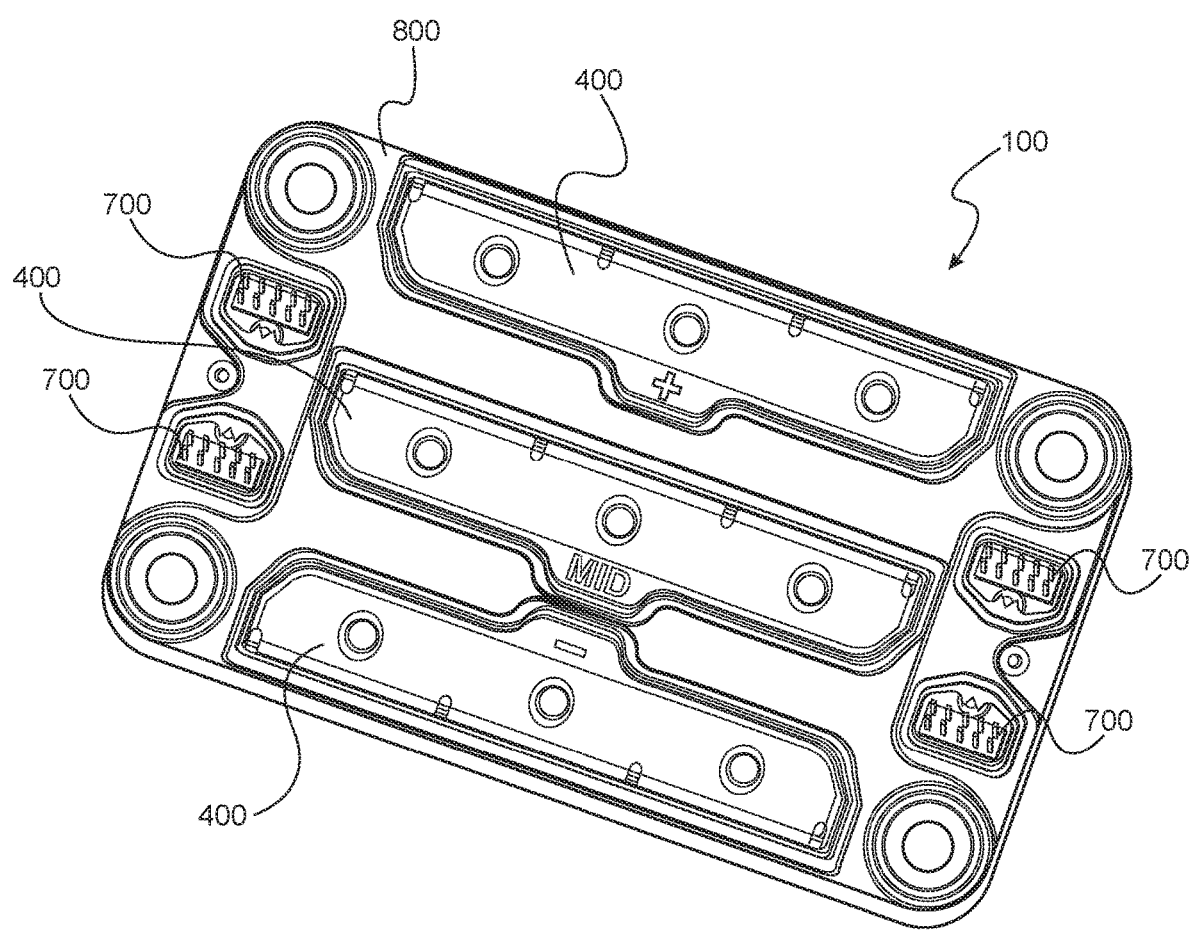
FIG. 4 illustrates a structural implementation of the power module of FIG. 1.
Figure 5:
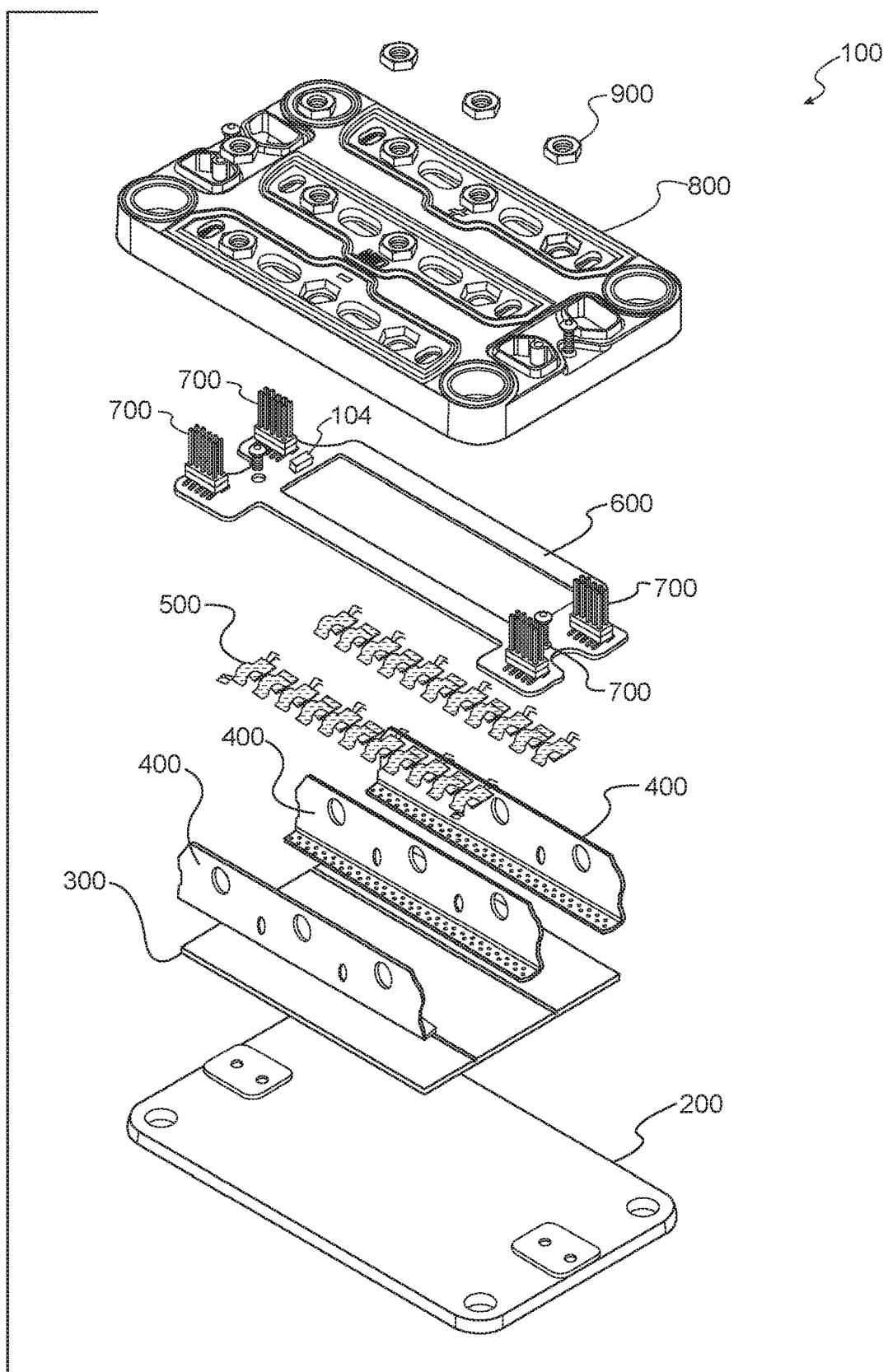
FIG. 5 illustrates an exploded view of the power module of FIG. 4.
Figure 6:
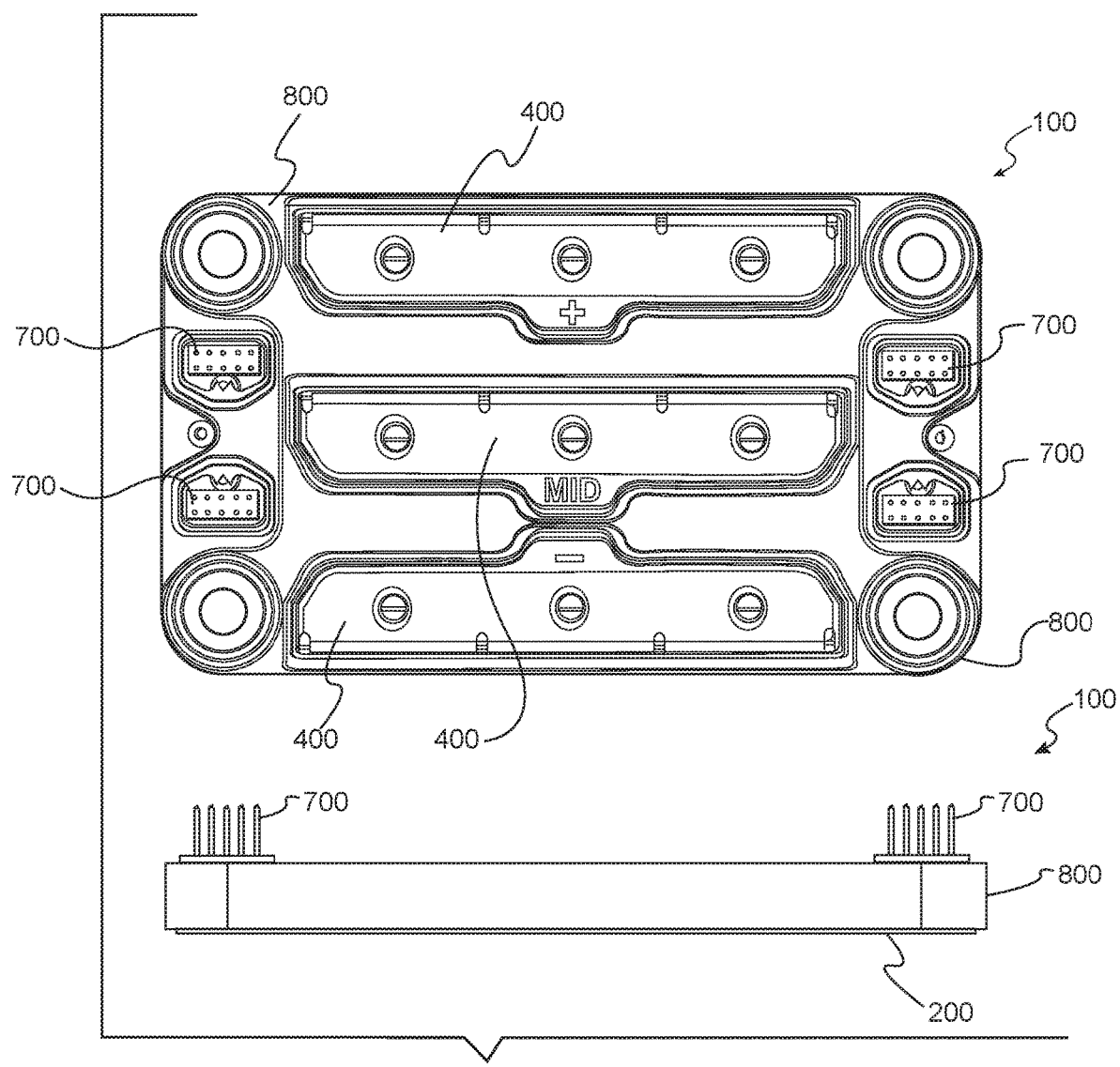
FIG. 6 illustrates a relative size to thickness comparison of the power module of FIG. 4.

FIG. 4 illustrates a structural implementation of the power module of FIG. 1; FIG. 5 illustrates an exploded view of the power module of FIG. 4; and FIG. 6 illustrates a relative size to thickness comparison of the power module of FIG. 4.

The power module 100 may be configurable in multiple useful power electronic topologies such as half bridge, full bridge, common source/emitter, and common drain/collector and can be configured in two, four, and six separate channels. Moreover, the power module 100 can be configured with any number of separate channels.

The power module 100 may include a number of elements as described in relation to FIG. 1. These elements may include the base plate 200, the power substrate 300, the power contacts 400, the power devices 500, the gate-source PCB 600, the gate drive connectors 700, the housing 800, and the like. The power module 100 may further include one or more fasteners 900 for securing electrical connections. Additionally, as shown in FIG. 5, the clamp circuit 104 may be arranged on the gate-source PCB 600.

In one aspect, the power module 100 may be configured with a footprint common in the power electronics industry. In one aspect, the footprint of the power module 100 may be implemented with a 62 m×107 mm base plate 200 with M6 mounting holes arranged 48 mm×93 mm apart. In one aspect, using a common footprint allows for customers with existing systems to utilize the power module 100 without investing in a system redesign. Of course, other size implementations are contemplated as well.

While in some aspects the length and width of the power module 100 fits industry standards, the height of the power module 100 may be two times to three times thinner than prior art implementations. In one aspect, the power module may be 15 mm or less in thickness. In one aspect, the power module may be 13 mm or less in thickness. In one aspect, the power module may be 10 mm or less in thickness. This dramatically reduces the power module inductance and increases current carrying capability partially by utilizing lower path lengths. It may also provide a major source of system level volume savings in a power converter or other application.

The comparison of top size to thickness dimensions of the power module 100 are presented in FIG. 6 in the top and side view comparison. In one aspect, the power module 100 measures 65 mm×110 mm×10 mm. The housing 800 may extend like a sheath over the base plate 200 for voltage isolation, which accounts for an extra 3 mm on each side over the base plate 200 dimensions. In one aspect, the power module 100 may have a volume of 71.5 cm$^3$ and weigh approximately 140 g. In another aspect, the power module 100 measures 65 mm×110 mm×less than or equal to 13 mm.

In another aspect, the power module 100 measures 65 mm×110 mm×less than or equal to 15 mm.

In one aspect, the power module 100 may utilize 57.5 mm×73 mm, 42 cm², of the total footprint area for conduction. This is a 60% utilization solely for current carrying. The remaining area may be used for mounting, 5%, gate drive connections, 5%, and plastic features including minimum wall thickness, voltage creepage extenders, and strengthening ribs, 30%.

Figure 7:
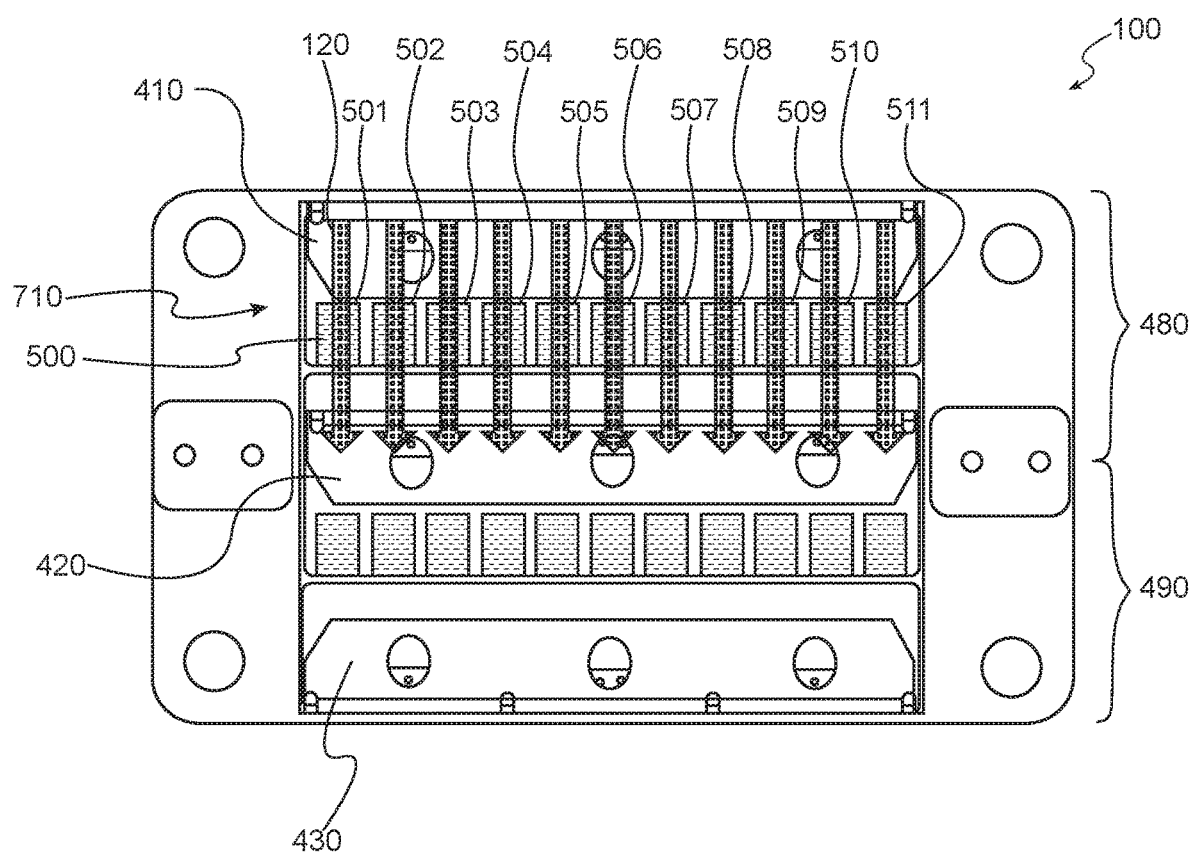
FIG. 7 illustrates a current flow for multiple paralleled devices of the power module of FIG. 4.

FIG. 7 illustrates a current flow for multiple paralleled devices of the power module of FIG. 4. As shown in FIG. 7, a power loop 710 of the power module 100 may be configured for effectively paralleling large numbers of power devices 500. In particular, FIG. 7 shows power devices 501-511. Nevertheless, it is contemplated that the power module 100 may include any number of power devices 500. In some aspects, the power module 100 can either have two, four, or more switch positions, depending on its configuration, which is detailed later. Moreover, the power module 100 can be configured with any number of switch positions. FIG. 7 shows an upper position 480 and a lower position 490. There is a large amount of flexibility in the formation of each switch position, such that they may be tailored to specific applications without costly power module 100 modifications. For example, the positions may have an equal number of diodes to the power devices 500, only a few diodes, or none at all. FIG. 7 is a representation of the power loop 710, depicting the even, shared current paths 120 for current traveling from the "V+" terminal 410 (400) to the "Mid" terminal 420 (400), the "V−" terminal 430 (400) is also shown that is used for power devices 500 in the lower position 490. An additional benefit of this layout is that the even spacing of each power device 500 aids in the spreading of the heat sources across the power module 100 instead of concentrating them in a few locations.

As further shown in FIG. 7, in certain aspects nearly the entire width of the power module 100 is utilized for the conduction of current. Many benefits would be lost if the power module 100 was tall. In the worst case, the length the current would travel through the power contact 410, 420, 430 would be longer than the path it travels once it reaches the power substrates 300. Accordingly, the power contacts 400 may be configured and designed to have a low height such that they contribute a negligible amount to the resistance and inductance of the system.

Figure 8:
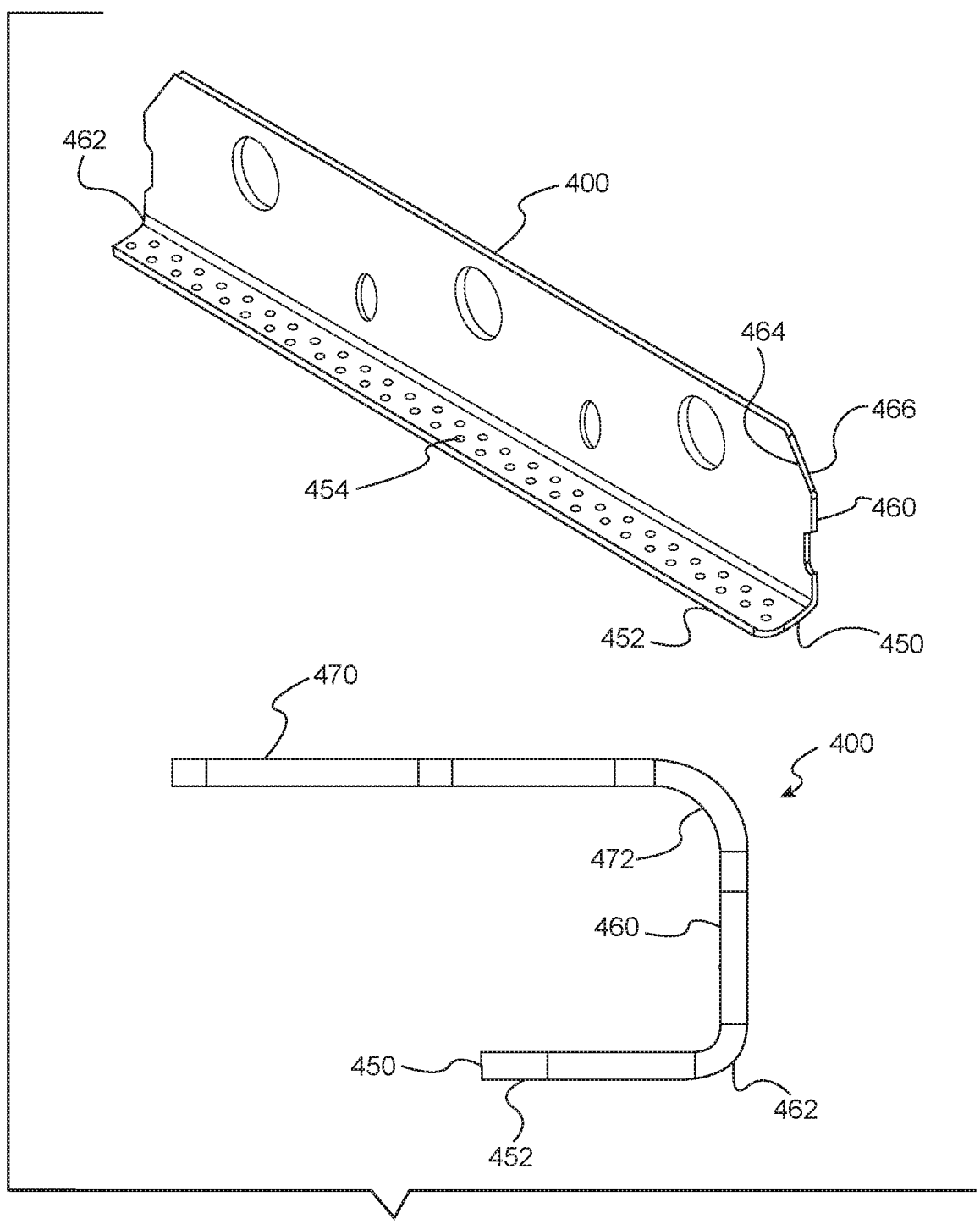
FIG. 8 illustrates the power contact configuration of the power module of FIG. 4.

FIG. 8 illustrates the power contact configuration of the power module of FIG. 4. In one aspect, the power contacts 400 may have a low height. The low height of the power contacts 400 may be achieved by using a dual bending process. First, the power contacts 400 may be formed through a metal stamping operation, by etching, or the like followed by forming in a press brake. A 90° bend at the base 450 creates an "L" shaped connector with a vertical body 460. The base 450 may be soldered down to the power substrates 300. The base 450 may be configured to be relatively thin in comparison to the overall shape. This reduces the area consumed by this bond, allowing for more active power device 500 area inside of the power module 100. To improve adhesion of this thin bond, staggered holes or solder catches 454 may be etched or formed along the bonding surface 452 on the bottom of the base 450. During manufacturing, molten solder may travel up the solder catches 454 through capillary action. Once solidified, the solder inside of the solder catches 454 substantially improves bond strength in many directions. An exemplary power contact 400 with solder catches 454 is illustrated in FIG. 8.

Figure 9:
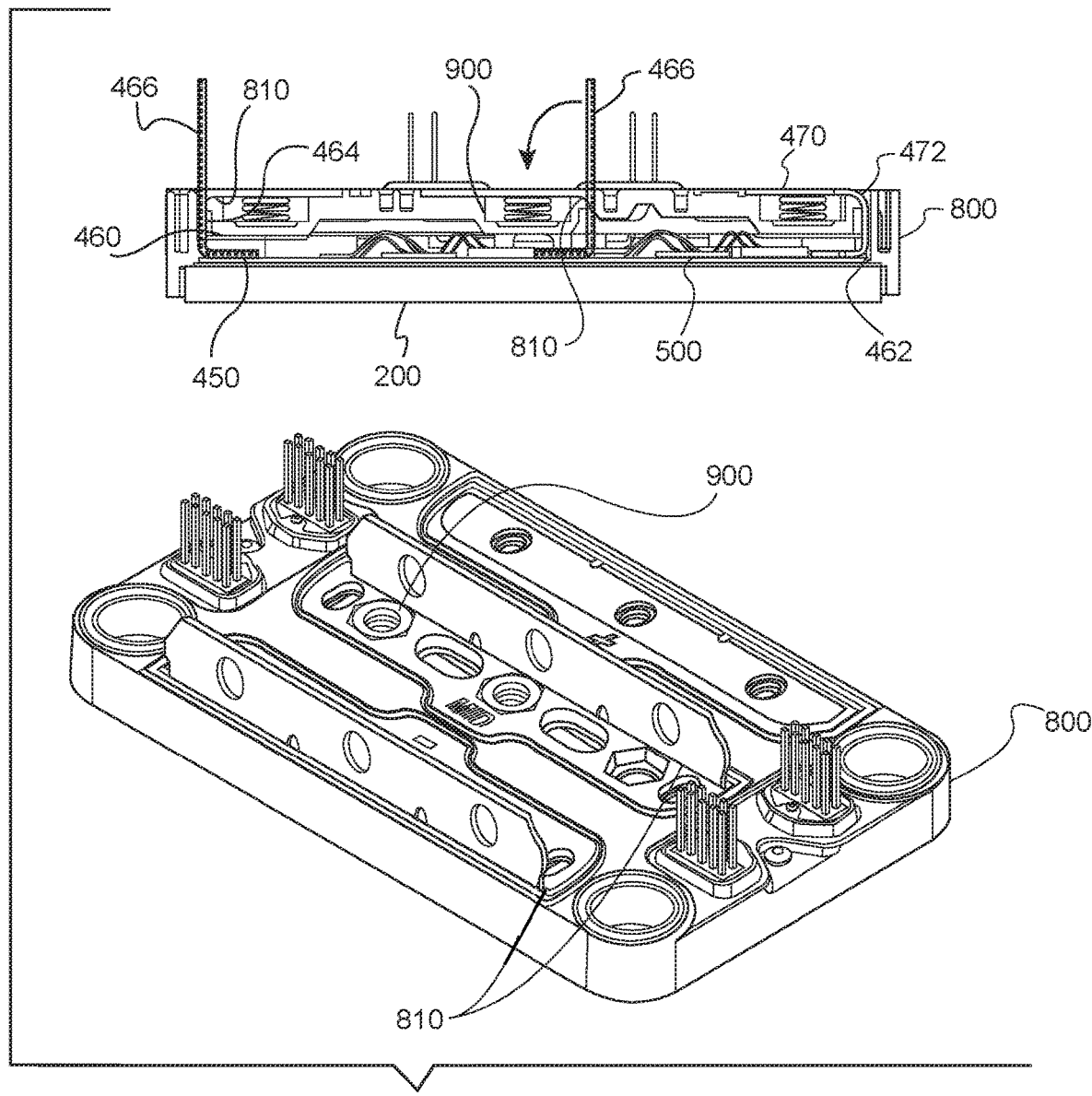
FIG. 9 illustrates the low profile power contact of the power module of FIG. 4.

Also shown in FIG. 8 is illustrated the manner in which the "L" shaped power contacts 400 may be bent a second time at the end of the fabrication process to form a contact top 470. Before bending, the vertical body 460 of the power contact 400 may allow for the housing 800 to be dropped into place, as there are no undercuts present. In certain aspects, the housing 800 may be a single piece plastic housing. The radius of the second bend 472 may not be as large as the first bend 462. This provides some tolerance in the process and may result in a smoother bending operation. The second radius 472 may be facilitated through a preformed radius 810 in the plastic housing 800, which, at this stage, may be touching the leading edge 464 of the power contacts 400. Specifically designed rotating bending hardware may press flatly on the opposite surface 466, folding the power contacts 400 down over the captive fasteners 900. An illustration of the bending of the "L" shaped contacts into "C" shaped forms is illustrated in FIG. 9 by the curved arrow.

Underneath the folded power contacts 400 may be arranged low profile fasteners 900 and in one aspect, the fasteners 900 may be threaded. For example, the fasteners may be nuts. These fasteners 900 may be captured underneath the power contacts 400. The fasteners 900 may otherwise be loose. The captive fasteners 900 may be arranged such that when the power module 100 is bolted to buss bars, the fasteners 900 and the power contacts 400 are pulled upwards into the bussing, forming a better quality electrical connection. If the fasteners 900 were affixed to the housing 800, they could act to pull the bussing down into the power module 100, which could form a poor connection due to the stiffness of the buss bars.

Figure 10:
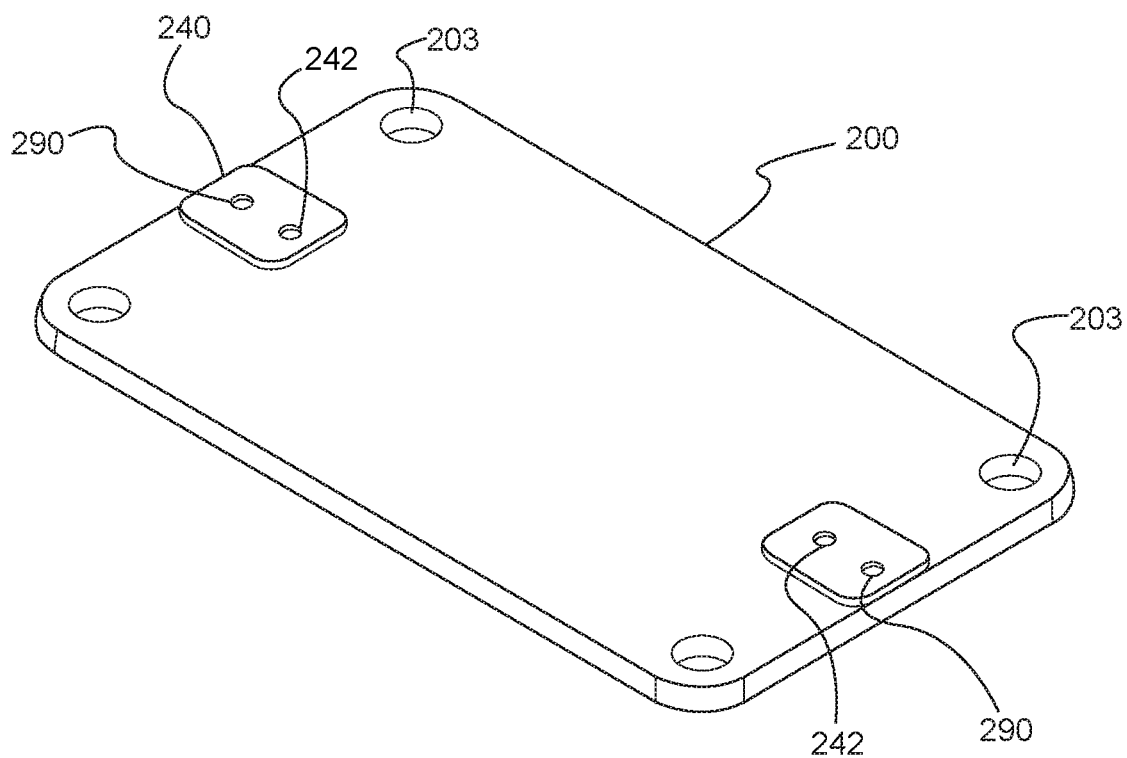
FIG. 10 illustrates the power module base plate of the power module of FIG. 4.

FIG. 10 illustrates the power module base plate of the power module of FIG. 4. In particular, FIG. 10 shows how the power module 100 base plate 200 may be configured to match an industry standard 62 mm geometry, which has a set diameter and location for the mounting holes 203 in the corners. The thickness of the base plate 200 in some aspects may be fine-tuned through the use of parametric finite element analysis of a CAD model. This may be achieved by sweeping the thickness between pre-defined practical limits and measuring the thermal and mechanical responses. The material and thickness combinations that achieves the best thermal performance with a minimal mechanical deflection may then be selected. Additional features of the power module 100 plate may be machined or molded, depending on the MMC material, to include standoffs 240, which may include a threaded board hole 242 and a housing hole 290. The standoff 240 may provide a planar surface with the power substrate 300 such that the gate-source PCB 600 can be bolted down without bowing.

Figure 11:
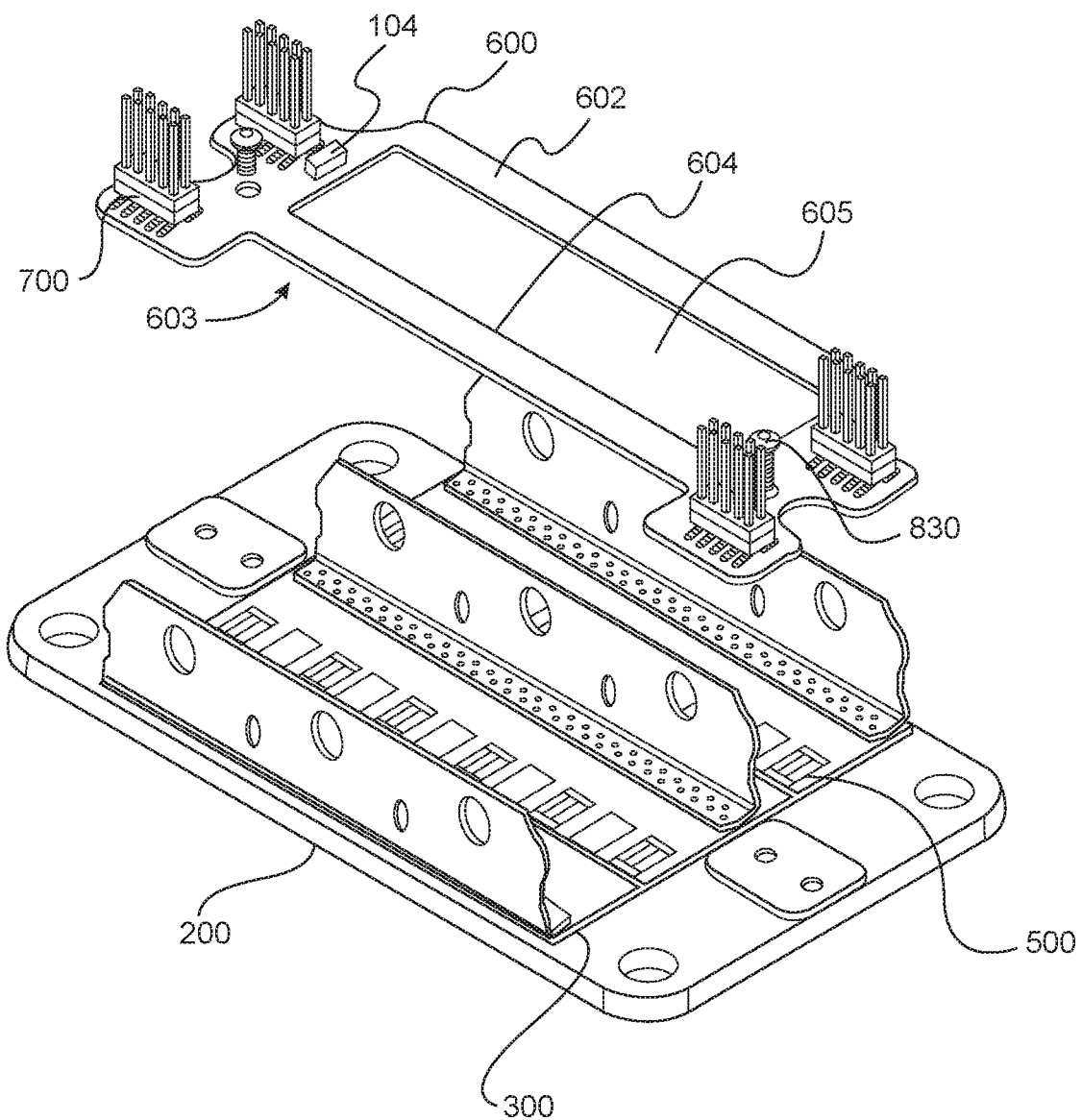
FIG. 11 illustrates the gate-source PCB of the power module of FIG. 4.

FIG. 11 illustrates the gate-source PCB secondary substrate of the power module of FIG. 4. The gate-source PCB 600 may include independent electrical paths for each switch position that may be required to form gate and source kelvin connections, which may be necessary for controlling the power devices 500. Additionally, the gate-source PCB 600 may include the clamp circuit 104. The power devices 500 may be arranged in parallel with the gate and source kelvin routing configured such as to not interfere with the wide, equalized power paths. FIG. 11 shows how the power module 100 and its variations may include a single piece secondary gate-source PCB 600 which may be placed over the power substrate 300 and then may be fastened to the base plate 200.

Figure 12:
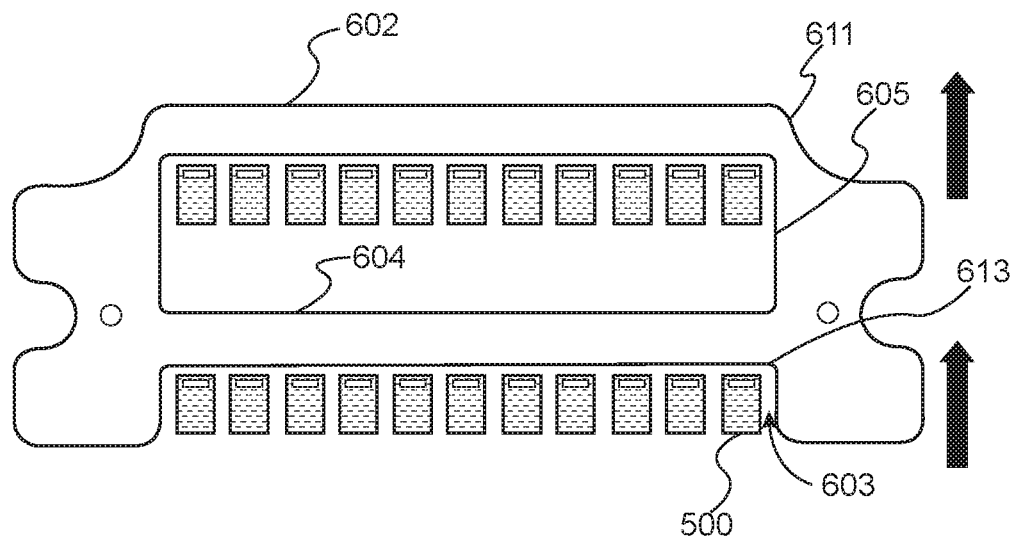
FIG. 12 illustrates the gate-source PCB having a half bridge arrangement of the power module of FIG. 4.
Figure 13:
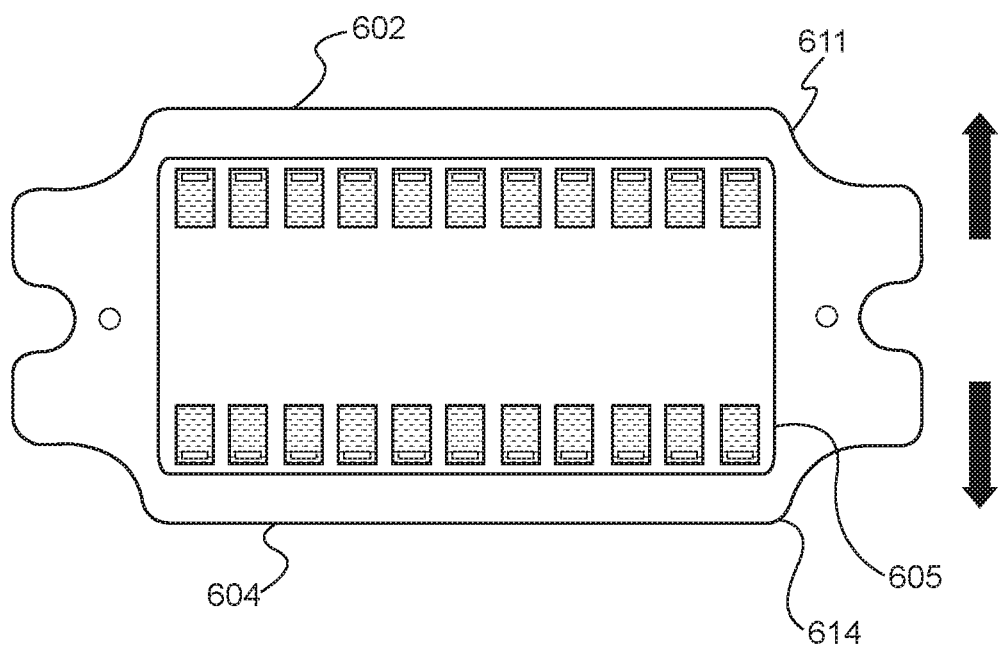
FIG. 13 illustrates the gate-source PCB having a common source/emitter arrangement of the power module of FIG. 4.
Figure 14:
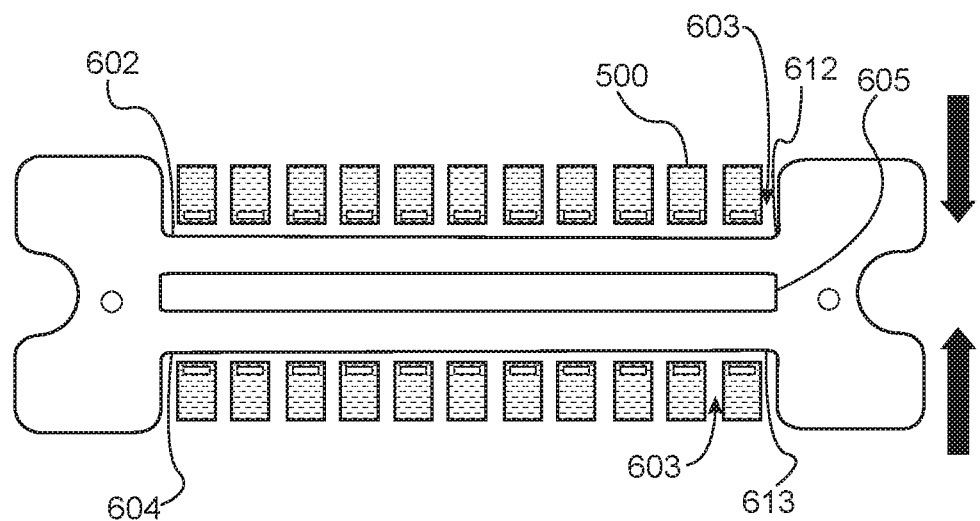
FIG. 14 illustrates the gate-source PCB having a common drain/collector arrangement of the power module of FIG. 4.

As shown in FIGS. 11 through 15, the gate-source PCB 600 may have two interconnection channels 602, 604 that may be located in one of four positions: top or first 611, upper middle or second 612, lower middle or third 613, and bottom or fourth 614 to define die apertures such as an external die aperture 603 or middle die aperture 605 to allow for a multitude of power module 100 configurations. The gate-source PCB 600 may utilize other positions and interconnection channels as needed. Essentially, the relative layout of each interconnection channel 602, 604 may be the same. However, the location and direction may be adapted to match the associated die aperture 603, 605 and the power device 500 placement and rotation to match each topology. This is illustrated in FIG. 12, FIG. 13, and FIG. 14 with the arrows indicating the gate direction for a half bridge, common source/emitter, and common drain/collector topology, respectively. Each of these may include a single or dual channel arrangement, depending on the layout of the power substrate 300 and the format of the power contacts 400 and housing 800.

Figure 15:
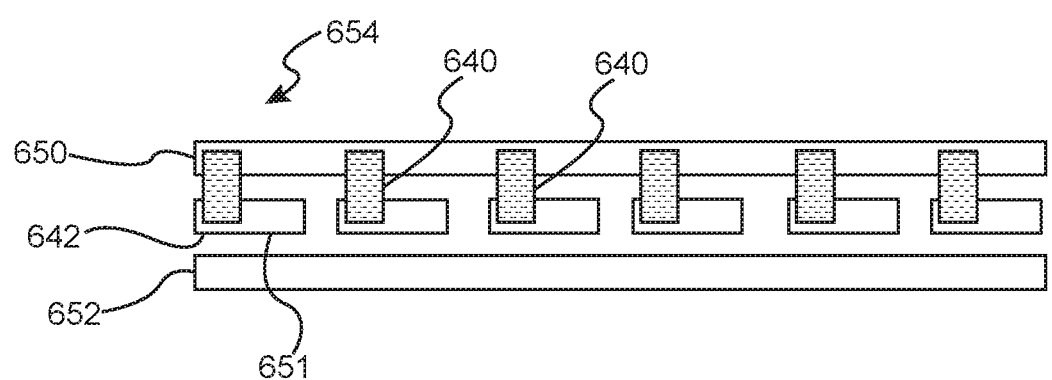
FIG. 15 illustrates a single layer modular gate-source PCB example layout of the power module of FIG. 4.

As shown in FIG. 15, to aid in paralleling, individual ballast resistors 640 may be included on the gate-source PCB 600. While there are many different layouts these boards can utilize such as parallel planes, clock tree distribution, etc., one of the more effective is a low cost single layer modular arrangement with many bonding locations 642. As shown, a gate track 650 and source track 652 may extend across the length of the interconnection channels 654. Source wire bonds may be formed directly on the source track 652. Each gate may be bonded to individual gate pads 651, which may be connected to the gate track through resistors 640. The values of the resistors 640 are device and application dependent and will vary between power module 100 configurations.

Figure 16:
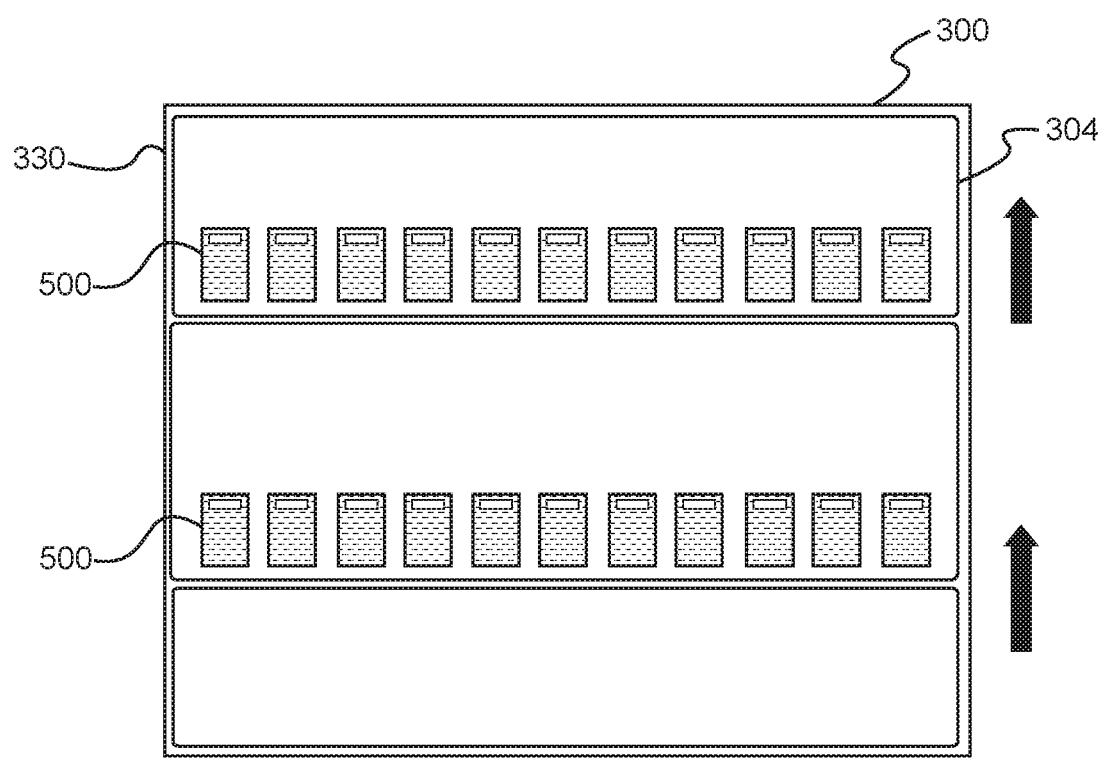
FIG. 16 illustrates the power substrate half bridge arrangement of the power module of FIG. 4.
Figure 17:
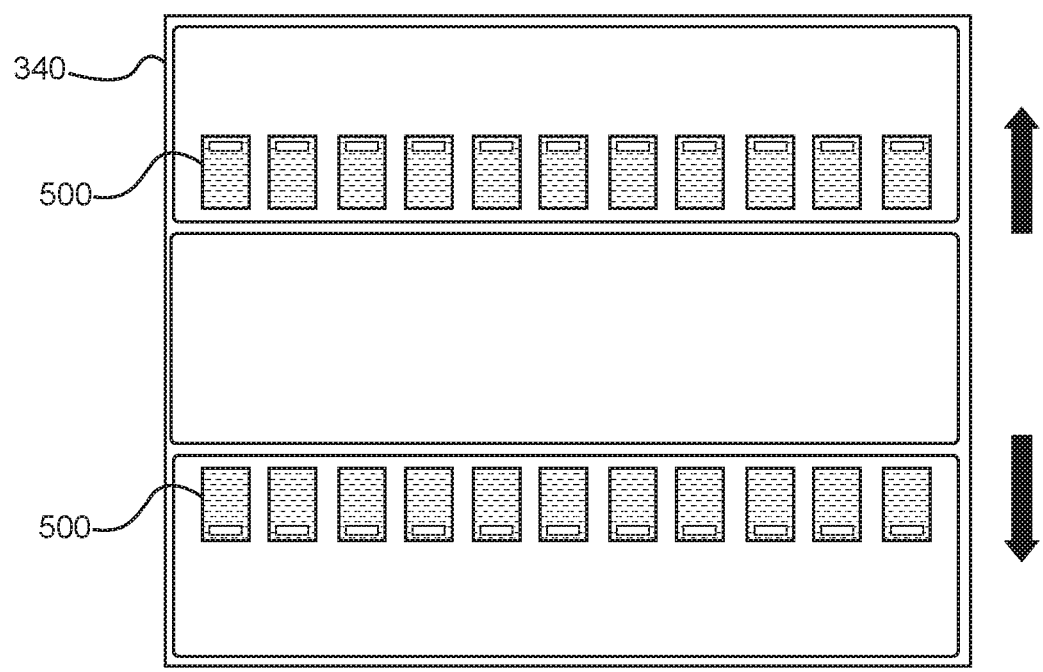
FIG. 17 illustrates the power substrate common source/emitter arrangement of the power module of FIG. 4.
Figure 18:
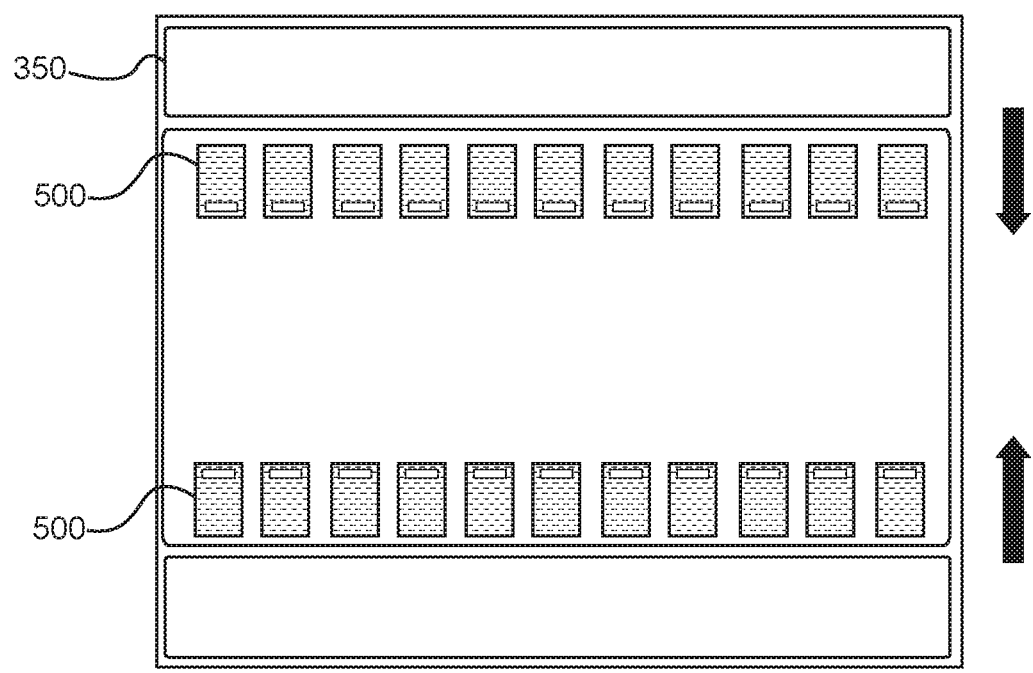
FIG. 18 illustrates the power substrate common drain/collector arrangement of the power module of FIG. 4.

FIG. 16 illustrates the power substrate half bridge arrangement of the power module of FIG. 4; FIG. 17 illustrates the power substrate common source/emitter arrangement of the power module of FIG. 4; and FIG. 18 illustrates the power substrate common drain/collector arrangement of the power module of FIG. 4. In particular, FIG. 16 shows the power substrate 300. The metal layers 304 may be etched into topology specific patterns 330, 340, 350 as illustrated in FIG. 16 for a half bridge substrate 330, FIG. 17 for a common source/emitter substrate 340, and FIG. 18 for a common drain/collector substrate 350 showing the upper and lower device 500 positions for each configuration. Also note that each of these layouts may be split into a dual channel arrangement by etching a line down the center of the power substrates 300. They may also be split into individual substrates per channel if desired. This may be useful for more harsh environments as the smaller substrates will experience less stress.

Figure 19:
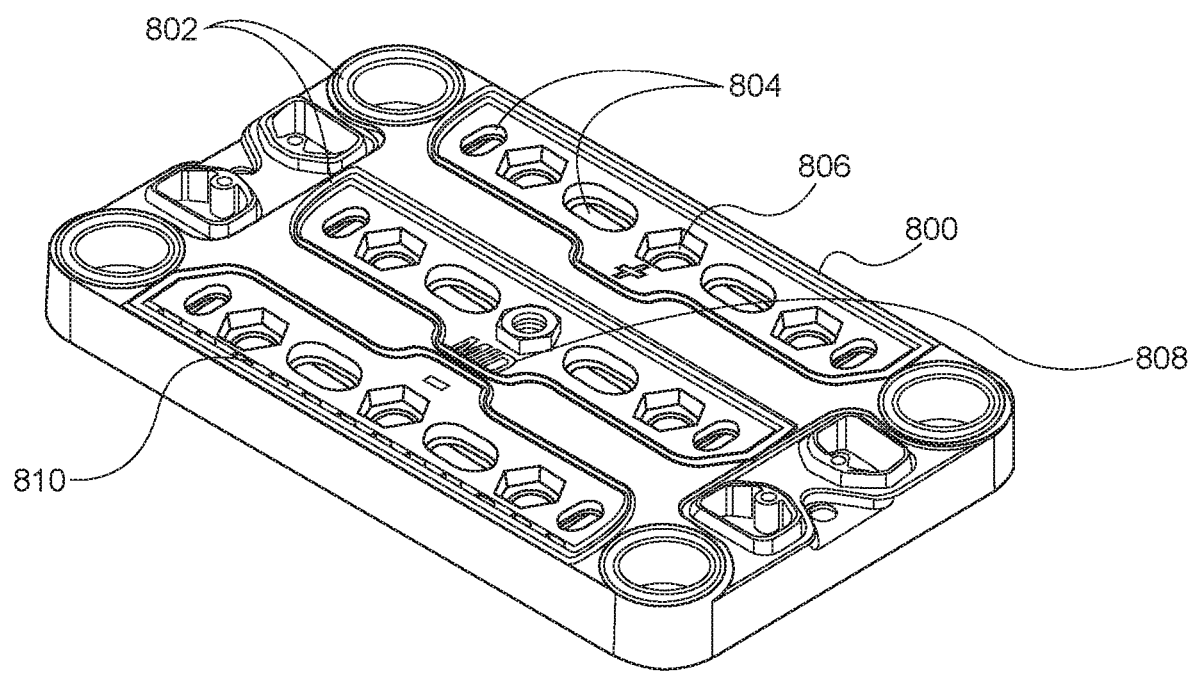
FIG. 19 illustrates the housing topside features of the power module of FIG. 4.
Figure 20:
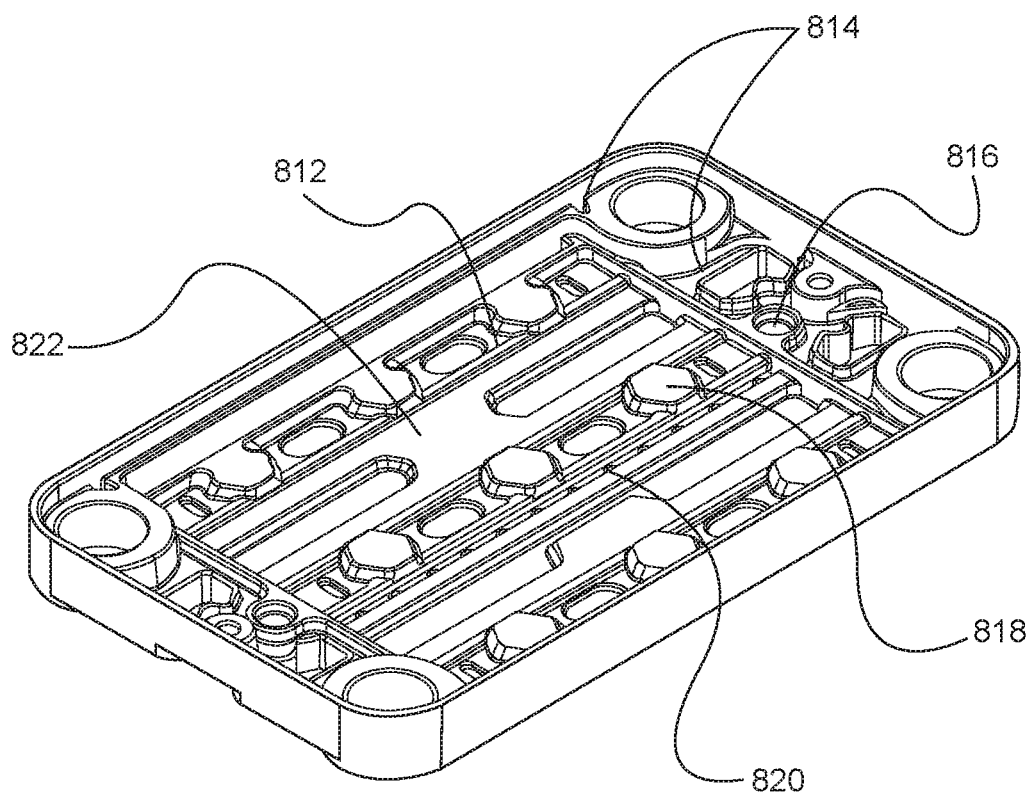
FIG. 20 illustrates the housing backside features of the power module of FIG. 4.

FIG. 19 illustrates the housing topside features of the power module of FIG. 4; and FIG. 20 illustrates the housing backside features of the power module of FIG. 4.

The housing 800 may be formed in an injection molding process with reinforced high temperature plastic. The housing 800 may serve many functions in addition to being a protective barrier to the sensitive power devices 500. This includes voltage blocking, mechanical support for the captive fasteners 900, guides for the power contact bending process, entry zones for gel passivation, vents for the gel passivation process, and self-strengthening internal ribs 812. Many of these features are depicted in FIG. 19 and FIG. 20. High aspect ratio trenches may be placed around the periphery of the power contacts 400 to increase the surface distance between exposed metal contacts, increasing voltage blocking capability.

FIG. 19 shows the high temperature plastic housing topside features including the creepage extenders 802, the passivation entries and vents 804, the captive fasteners apertures 806, the labeling area 808, and the power contact pinch and radius 810. FIG. 20 shows the backside features including the strengthening ribs 812, the thick bolt hole core sections 814, the bolt head clearance recess 816, the bottoms of the fastener insets 818, the power contact entryways 820, and the wire bond clearance apertures 822.

Figure 21:
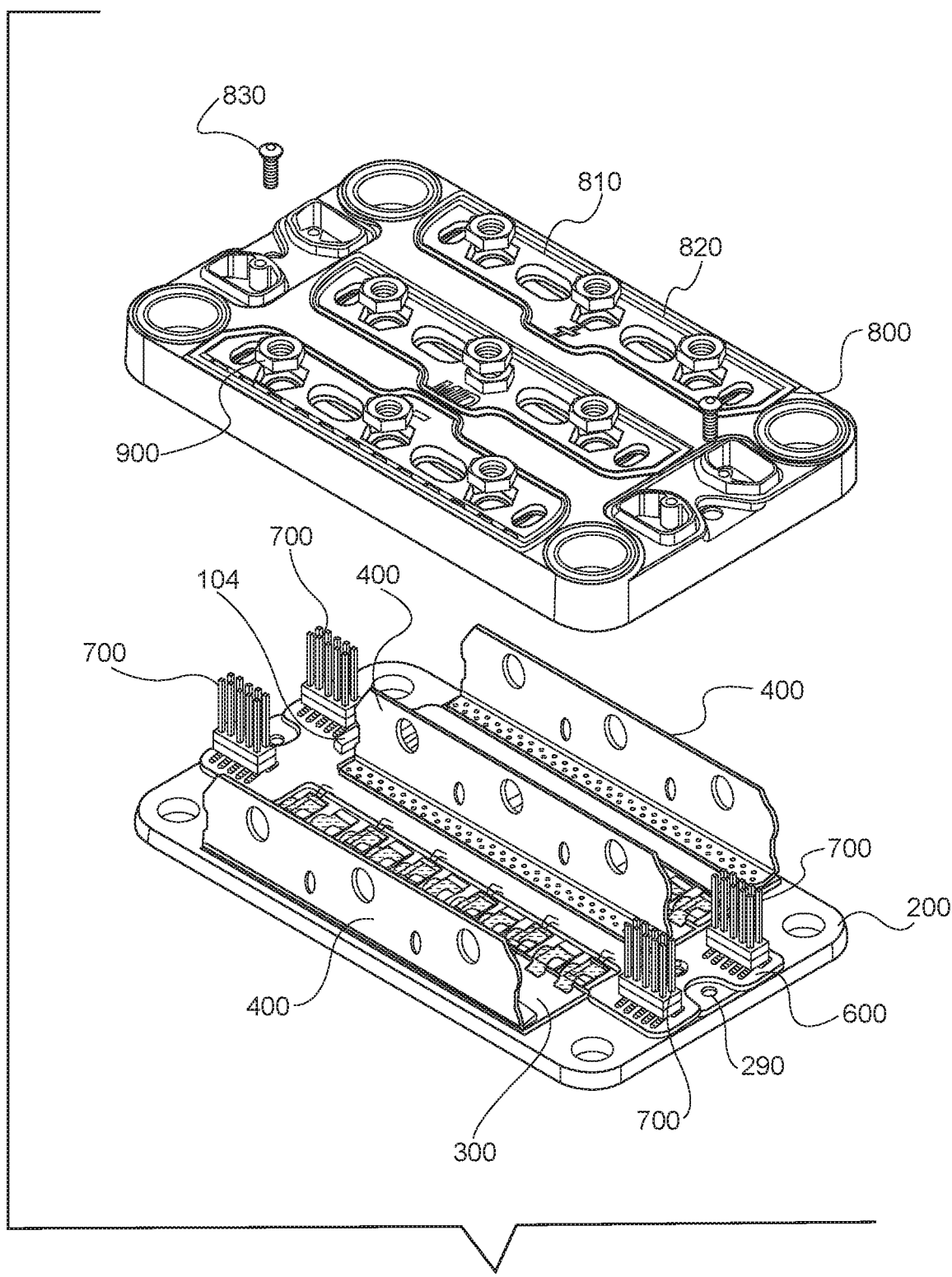
FIG. 21 illustrates the housing separated from the power module assembly of the power module of FIG. 4.
Figure 22:
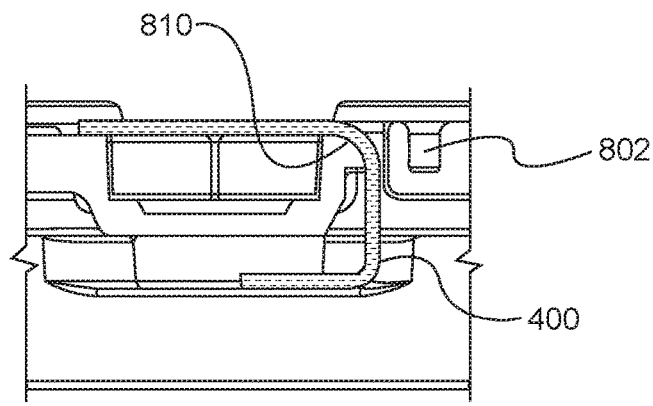
FIG. 22 illustrates the power contact guides of the power module of FIG. 4.

FIG. 21 illustrates the housing separated from the power module assembly of the power module of FIG. 4; and FIG. 22 illustrates the power contact guides of the power module of FIG. 4.

FIG. 21 shows how the housing 800 slides over the electronic sub assembly to form the top of the power module 100, with the power contacts 400 routed through the narrow openings or slots 820. The housing 800 may be bolted 830 at two points to threaded housing holes 290 on the base plate 200. At this stage the gel passivation material may be injected into the power module 100 and fully cured. Multiple openings and vents 804 assist this assembly step. The slots 820 in the housing 800 for the power contacts 400 have drafted "guides" to aid this process, and a rounded fillet 810 on top to aid in the bending procedure. These are illustrated in FIG. 22.

As discussed earlier, the power module 100 is configurable in a variety of useful power electronic topologies. These include half bridge, common source/emitter, and common drain/collector. Splitting the channels, through layout changes in the power substrate 300 and gate-source PCB 600 and alterations to the power contacts 400 and housing 800, allows three more configurations, including a full bridge, common source/emitter dual channel, and common drain/collector dual channel.

Figure 23:
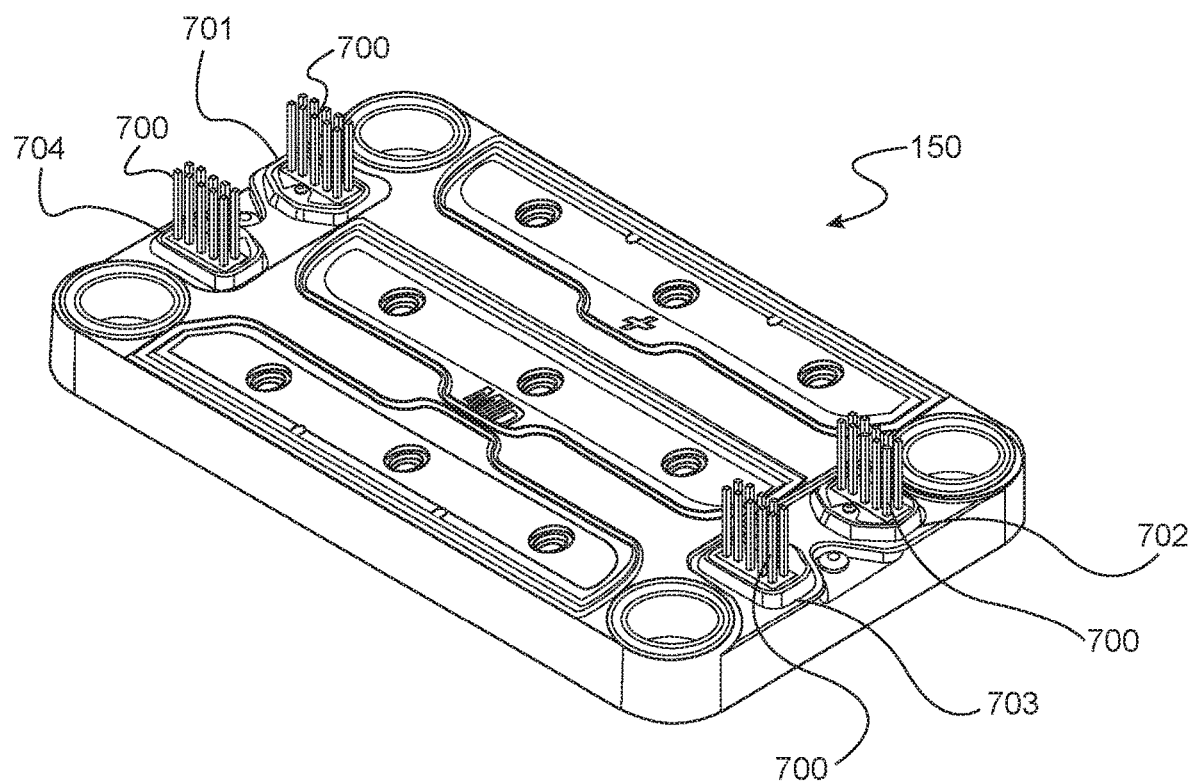
FIG. 23 illustrate the half bridge, single channel common source/emitter or drain/collector module of the power module of FIG. 4.
Figure 24:
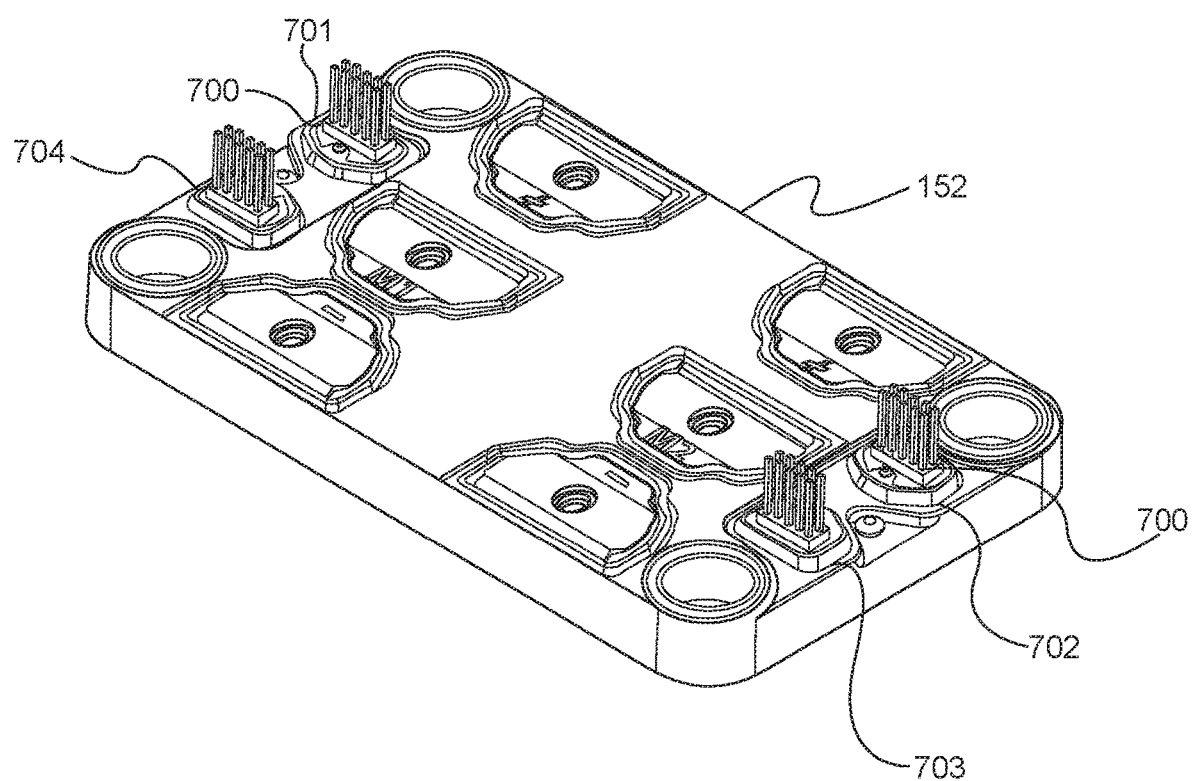
FIG. 24 illustrates the full bridge, dual channel common source/emitter or drain/collector module of the power module according to another aspect of the disclosure.
Figure 25:
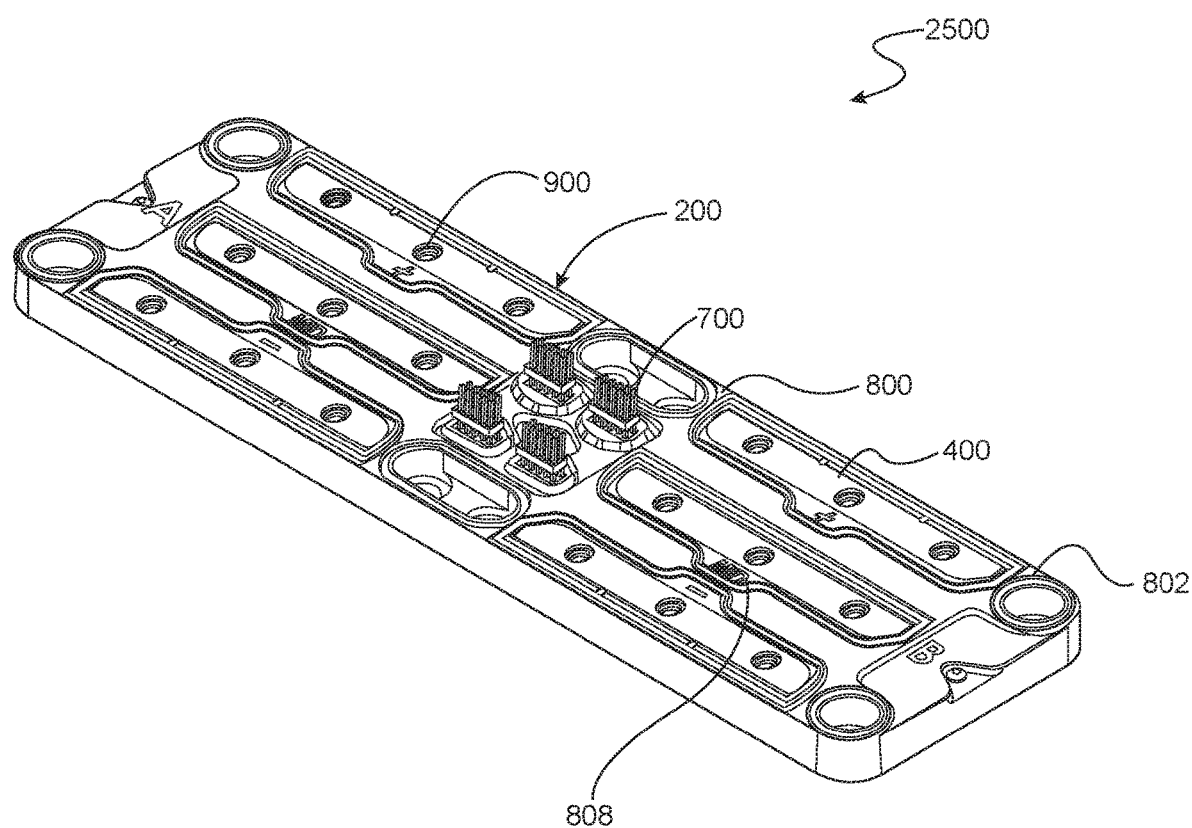
FIG. 25 illustrates the extended single housing side-by-side module configuration of the power module according to another aspect of the disclosure.

FIG. 23 illustrates the half bridge, single channel common source or drain/collector module of the power module of FIG. 4; FIG. 24 illustrates the full bridge, dual channel common source/emitter or drain/collector module of the power module according to another aspect of the disclosure; and FIG. 25 illustrates the extended single housing side-by-side module configuration of the power module according to another aspect of the disclosure.

FIG. 23 illustrates the first external configuration 150 for half bridge, single channel common source/emitter, and single channel common drain/collector configurations. There are four locations 701, 702, 703, 704 for the gate drive connections 700, two on each side. Either or both sides may be used for this purpose. For the dual channel arrangement 152, shown in FIG. 24, the power contacts 400 are split and provide two fully isolated channels. Gate drive connectors 700 on both sides may now be required. This arrangement is used for a full bridge, dual channel common source/emitter, and dual channel common drain/collector topologies.

For higher currents and for customers who desire a single module, a larger side-by-side arrangement of a dual power module 2500 may be fabricated from two modules built side by side into a single housing 800. This is illustrated in FIG. 25.

Accordingly, the disclosure has set forth an improved power module 100 having an integrated clamp circuit having numerous benefits described herein. For example, the placing of the clamp circuit 104 in close physical proximity to the power module 100 improves performance of the power devices 500. Moreover, placing the clamp circuit 104 in close physical proximity to the power module 100 reduces customer complexity with respect to operation and control of the power module 100. Applications of the power module 100 include motor drives, solar inverters, circuit breakers, protection circuits, DC-DC converters, and the like.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power module apparatus, comprising:
a power substrate;
a plurality of power devices electrically connected to the power substrate;
a gate-source board mounted relative to the power substrate, the gate-source board electrically connected to the plurality of power devices;
a housing secured to the power substrate;
gate drive connectors configured to electrically connect to a signal line, the gate drive connectors configured to receive gate drive signals, from the signal line, generated from a gate driver that is arranged separate from the power module apparatus, and the gate drive connectors are electrically connected to a gate of the plurality of power devices;
a clamping circuit arranged inside the power module apparatus and electrically connected to the signal line between the plurality of power devices and the gate drive connectors, the clamping circuit configured to be responsive to the gate drive signals received by the gate drive connectors, the clamping circuit configured to clamp an input to the gate of the plurality of power devices, and the input to the gate comprising the gate drive signals generated from the gate driver received on the signal line by the gate drive connectors; and
the clamping circuit being integrated within the power module apparatus and the clamping circuit being arranged with at least one of the following: a base plate, the power substrate, one of at least two power contacts, the plurality of power devices, the gate-source board, the gate drive connectors, and the housing,
wherein the gate driver is implemented separate from the power module apparatus and the clamping circuit;
wherein the gate drive connectors are configured to receive the gate drive signals generated from the gate driver and provide the gate drive signals to the signal line that is connected to the clamping circuit and the gate of the plurality of power devices;
wherein the clamping circuit is configured to short the gate of the plurality of power devices to a negative voltage bias (−V);
wherein the at least two power contacts are configured to extend through the housing,
wherein the housing configured to define fastener apertures configured to receive fasteners positioned in the fastener apertures; and
wherein the at least two power contacts being bent and extending over the fastener apertures to retain the fasteners in the fastener apertures.

2. The power module apparatus of claim 1, wherein:
the power module apparatus is configured with a plurality of separate channels;
the clamping circuit comprises a plurality of clamping circuits;

at least one of the plurality of clamping circuits being configured for operation with at least one of the plurality of separate channels of the power module apparatus;

at least one of the plurality of clamping circuits comprise a Miller clamp; and the Miller clamp is integrated into the power module apparatus.

3. The power module apparatus of claim 1, wherein:

the gate-source board is structured to form gate connections to the plurality of power devices to control the plurality of power devices; and the clamping circuit is arranged on the gate-source board and connected to the signal line.

4. The power module apparatus of claim 1, wherein:

the clamping circuit comprises a transistor discretely holding the plurality of power devices off;

the transistor of the clamping circuit being arranged in the power module apparatus;

the transistor of the clamping circuit being connected to the signal line and the transistor of the clamping circuit being configured to receive the gate drive signals generated from the gate driver on the signal line;

the transistor is connected to at least one of the following: a source/emitter of the plurality of power devices and a negative voltage bias (−V); and the transistor is configured to short the gate of the plurality of power devices to at least one of the following: the source/emitter of the plurality of power devices and the negative voltage bias (−V).

5. The power module apparatus of claim 4, wherein:

the transistor is connected to the gate of the plurality of power devices;

the transistor is further connected to the source/emitter of the plurality of power devices; and the transistor is configured to short the gate of the plurality of power devices to the source/emitter of the plurality of power devices.

6. The power module apparatus of claim 1, further comprising:

a sense and control circuit electrically connected to the clamping circuit;

the sense and control circuit configured to sense a current and/or a voltage within the power module apparatus;

the sense and control circuit configured to control the clamping circuit as a function of the current and/or the voltage within the power module apparatus; and the sense and control circuit is integrated into the power module apparatus.

7. The power module apparatus of claim 1 further comprising:

a sense and control circuit electrically connected to the clamping circuit;

the sense and control circuit configured to detect the gate driver signals from the gate driver;

the sense and control circuit configured to detect the gate driver signals from the gate driver and disable the clamping circuit;

the sense and control circuit configured to detect a lack of the gate driver signals from the gate driver and enable the clamping circuit;

the sense and control circuit is integrated into the power module apparatus;

the base plate defining a topology pattern;

the power substrate positioned relative to the base plate;

the at least two power contacts, each of the at least two power contacts electrically connected to the power substrate; and the gate drive connectors are electrically connected to the gate-source board, wherein the topology pattern forms at least one of the following: a half bridge substrate, a common source/emitter substrate, and a common drain/collector substrate.

8. The power module apparatus of claim 1, wherein:

the signal line is configured to receive the gate drive signals generated from the gate driver and provide the gate drive signals to the clamping circuit and the gate of the plurality of power devices; and the clamping circuit is configured in an arrangement that results in better performance of the plurality of power devices with respect to a power device implemented with a clamping circuit arrangement in the gate driver.

9. The power module apparatus of claim 1, wherein:

the power module apparatus is configured with a plurality of separate channels;

the clamping circuit comprises a plurality of clamping circuits;

at least one of the plurality of clamping circuits being configured for operation with at least one of the plurality of separate channels of the power module apparatus; and at least one of the plurality of clamping circuits comprise a Miller clamp.

10. The power module apparatus of claim 9, wherein:

the Miller clamp is integrated into the power module apparatus.

11. The power module apparatus of claim 1, wherein the gate-source board is structured to form gate connections to the plurality of power devices to control the plurality of power devices.

12. The power module apparatus of claim 1, wherein the clamping circuit is arranged on the gate-source board and connected to the signal line.

13. The power module apparatus of claim 1, wherein:

the clamping circuit comprises a transistor discretely holding the plurality of power devices off; and the transistor of the clamping circuit being arranged in the power module apparatus.

14. The power module apparatus of claim 13, wherein:

the transistor of the clamping circuit being connected to the signal line and the transistor of the clamping circuit being configured to receive the gate drive signals generated from the gate driver on the signal line;

the transistor is connected to at least one of the following: a source/emitter of the plurality of power devices and a negative voltage bias (−V); and the transistor is configured to short the gate of the plurality of power devices to at least one of the following: the source/emitter of the plurality of power devices and the negative voltage bias (−V).

15. The power module apparatus of claim 14, wherein:

the transistor is connected to the gate of the plurality of power devices; and the transistor is further connected to the source/emitter of the plurality of power devices.

16. The power module apparatus of claim 14, wherein the transistor is configured to short the gate of the plurality of power devices to the source/emitter of the plurality of power devices.

17. The power module apparatus of claim 1, further comprising:

a sense and control circuit electrically connected to the clamping circuit;

the sense and control circuit configured to sense a current and/or a voltage within the power module apparatus;

the sense and control circuit configured to control the clamping circuit as a function of the current and/or the voltage within the power module apparatus; and the sense and control circuit is integrated into the power module apparatus.

* * * * *